(12) United States Patent
Kawanaka et al.

(10) Patent No.: US 7,746,910 B2
(45) Date of Patent: Jun. 29, 2010

(54) SEMICONDUCTOR LASER DIODE AND ITS FABRICATION PROCESS

(75) Inventors: Satoshi Kawanaka, Komoro (JP); Atsushi Nakamura, Komoro (JP); Masato Hagimoto, Komoro (JP); Hideki Hara, Saku (JP); Masakatsu Yamamoto, Saku (JP)

(73) Assignee: Opnext Japan, Inc., Yokohama-shi (JP)

( * ) Notice: Subject to any disclaimer, the term of this patent is extended or adjusted under 35 U.S.C. 154(b) by 0 days.

(21) Appl. No.: 12/023,168

(22) Filed: Jan. 31, 2008

(65) Prior Publication Data

US 2008/0181276 A1 Jul. 31, 2008

(30) Foreign Application Priority Data

Jan. 31, 2007 (JP) ............... 2007-020362

(51) Int. Cl.
*H01S 5/00* (2006.01)
(52) U.S. Cl. .................................. 372/45.013
(58) Field of Classification Search ............ 372/45.013
See application file for complete search history.

(56) References Cited

U.S. PATENT DOCUMENTS

| 4,730,327 | A | * | 3/1988 | Gordon | 372/45.01 |
| 4,956,682 | A | * | 9/1990 | Ohnaka et al. | 372/50.1 |
| 5,208,821 | A | * | 5/1993 | Berger et al. | 372/46.012 |
| 5,276,699 | A | * | 1/1994 | Kahen | 372/45.01 |
| 2001/0021209 | A1 | * | 9/2001 | Onishi | 372/43 |
| 2003/0076864 | A1 | * | 4/2003 | Sai et al. | 372/43 |

FOREIGN PATENT DOCUMENTS

| JP | 2002-353566 | 12/2002 |
| JP | 2006-165407 | 6/2006 |
| WO | WO 02/101894 A1 | 12/2002 |

* cited by examiner

*Primary Examiner*—Minsun Harvey
*Assistant Examiner*—Patrick Stafford
(74) *Attorney, Agent, or Firm*—Antonelli, Terry, Stout & Kraus, LLP.

(57) ABSTRACT

A semiconductor laser diode device with small driving current and no distortion in the projected image. The semiconductor laser diode includes an n-GaAs substrate and, an n-cladding layer on the n-GaAs substrate, an active layer, a p-clad layer, a multilayer formed from sequentially laminated p-contact layers, and a ridge formed by selectively etching from the upper surface of the p-contact active layer to a specified depth on the p-contact layer, and an insulating film deposited on the upper surface side of the n-GaAs substrate, and formed from the side surface of the ridge to the edge periphery of the n-GaAs substrate, and a p-electrode formed on the insulating layer deposited on the ridge of the P-contact layer, and an n-type electrode formed on the lower surface of the n-GaAs substrate; and the n-GaAs substrate structure possesses a side edge serving as an absorption layer to absorb light emitted at the active layer wavelength; and a groove is fabricated at the side edge forming the front facet (forward emission side), to a depth from the p-cladding layer exceeding the active layer, from a p-cladding layer section a specified distance away from the side of the ridge along the edge, to the side of the active layer; and the groove is covered by the insulating layer.

24 Claims, 17 Drawing Sheets

SEMICONDUCTOR LASER DIODE AND ITS FABRICATION PROCESS

CLAIM OF PRIORITY

The present application claims priority from Japanese application JP 2007-020362 filed on Jan. 31, 2007, the content of which is hereby incorporated by reference into this application.

FIELD OF THE INVENTION

The present invention relates to a semiconductor laser diode and a fabrication process for that semiconductor laser diode, and relates in particular to technology effective in production technology for fabricating real index guided structure type semiconductor laser diodes.

BACKGROUND OF THE INVENTION

Significant advances have been made in applications using 630 nanometer band AlGaInP (aluminum gallium indium phosphide) red semiconductor lasers (laser diodes: LD) in display devices because of good visual characteristics such as high brightness. One important application of these semiconductor laser diodes (Hereafter, called laser diodes) is projecting a laser beam onto an object for visual recognition in display devices such as markers and levelers. Since portability is a highly important condition, battery power is a main requirement. The laser diode must therefore consume as little electrical power as possible in order to allow long term operation from batteries. A high quality laser beam is also an essential element when using the laser diode as a display device.

One method effective in lowering the laser diode drive current is to use a semiconductor device with a real index guided structure possessing highly efficient light emission with minimal internal (waveguide-cavity) loss in the laser diode device. Structures of this type are disclosed (for example, in JP-A No. 2002-353566), where the conventional laser diode with a buried layer of GaAs (gallium arsenide) is replaced with a buried heterostructure laser diode of Al(Ga) InP (aluminum gallium indium phosphide) with extremely low light absorbance; and a ridge type laser diode (for example JP-A No. 2006-165407 and International Publication No. WO 02/101894) that utilizes the ridge side surface of the dielectric layer as a protective layer instead of a buried layer.

The semiconductor laser diode disclosed in JP-A No. 2006-165407 is formed with a structure to prevent light in the ridge section from leaking outside the laser by forming a facet (forward emission side) for emitting laser light, or a groove in the vicinity of the facet, or a concave section. This structure is capable of preventing ripples in the FFP (far field pattern) intensity distribution, and acquiring Gaussian shapes with good FFP.

The semiconductor laser diode disclosed in International Publication No. WO 02/101894 contains a facet including at least an active layer cross section the surface of the active layer prevents ripples from occurring in the FFP and acquires Gaussian shapes with good FFP.

SUMMARY OF THE INVENTION

The AlGaInP (aluminum gallium indium phosphide) red semiconductor laser utilized as a light source in display devices for levelers and markers was usually a buried heterostructure (loss guided type) solid state device. Also, GaAs (gallium arsenide) a comparatively high quality crystal and easy to form in epitaxial layers was generally utilized in the current blocking layer forming the buried layer and in most devices this current blocking layer is a material that absorbs the laser light.

FIG. 23 is a descriptive view showing the loss-guided type buried heterostructure for the laser diode 70. This laser diode 70 is formed as multiple epitaxial layers on the upper surface of the n-GaAs substrate 71. The structure of this multiple epitaxial layer includes a sequentially deposited n-cladding layer 72 of AlGaInP, an active layer 73 as a quantum well structure of AlGaInP where the quantum well is GaInP and the quantum barrier is made from AlGaInP, and a p-cladding layer 74 of AlGaInP. The active layer may also be a simple structure made from (Al) GaInP. The p-cladding layer 74 is then selectively stripped away (etching removal) from the upper surface to a specified depth to form a structure where one ridge 75 is formed extending in a stripe shape along the center upper surface of the n-GaAs substrate 71.

An n-current blocking layer 76 made from GaAs (gallium arsenide) is formed on a section of the p-cladding layer remaining on both sides of the ridge 75. This n-current blocking layer 76 pair encloses the ridge 75 from both sides. A p-contact layer 77 made from GaAs is formed on the n-current blocking layer 76 and the ridge 75.

Both sides of the laser diode 70 are subjected to mesa etching, to form a mesa (table section) from the p-contact layer 77 to the n-type cladding layer 72.

A p-electrode 78 is formed on the upper surface of the p-contact layer 77, and an n-electrode 79 is formed on the lower surface of the n-GaAs substrate 71. Though not shown in the drawing, reflection coatings are formed respectively on the side surfaces (facets) of the laser diode 70 that form both sides of the ridge 75. A facet coating film is formed on the front facet (forward emission side) that is one end among both ends of the laser diode 70. Also a facet coating film whose reflectivity is the same or higher than the front facet, is formed on the rear facet (rear emission side) which is the other end (of laser diode 70).

This loss-guide type buried heterostructure laser diode has the problem that light is absorbed and lost in the current blocking layer so that improving the light emission efficiency of the laser diode is impossible and meeting user requests to suppress the power consumption in the semiconductor laser diode by lowering the drive current could not be achieved. In many cases, where the product is drive by batteries such as in leveling and marking applications, so reducing the electrical power consumption over a long operating period (drive time) was a major problem, making it essential to reduce the driving current in the semiconductor laser device.

On the other hand, a buried heterostructure laser diode with real index guided structure, and a ridge structure laser diode with real index guided structure have been successfully developed in recent years whose current blocking layer material has been changed to Al(Ga)InP which does not easily absorb light. The drive current can therefore be greatly reduced in these devices.

FIG. 24 is a concept drawing showing the buried heterostructure laser diode 85 with real index guided structure. This buried heterostructure laser diode 85 is the same structure as the laser diode 70 shown in FIG. 23 with the exception that the material of the n-current blocking layer is different. Namely in the case of the laser diode 70 the n-current blocking layer 76 is formed from GaAs that easily absorbs laser light. However in the case of the buried heterostructure laser diode 85, the n-current blocking layer 86 is formed from Al (Ga) InP which resists absorption of laser light. In FIG. 24, the names and material identical to those of the laser diode 70 are assigned the same reference numerals as in the description of laser diode 70.

FIG. 25 is a concept drawing showing the ridge structure laser diode 90 with real index guided structure. In this ridge structure laser diode 90, a multiple epitaxial layer is formed on the upper surface of the n-GaAs substrate 91. This multiple epitaxial layer is structure of sequential layers including an n-cladding layer 92 formed from AlGaInP, and an active layer 93 for a multiple quantum well structure formed from AlGaInP where the quantum well is GaInP and the quantum barrier is made from AlGaInP, a p-cladding layer 94 made from AlGaInP, and a p-contact layer 95 made from GaAs. The active layer may be a single layer structure made from (Al) GaInP. The p-contact layer 95 is then selectively stripped away (etching removal) from the upper surface of p-contact layer 95 to a specified depth of p-cladding layer 94 to form a structure where one ridge 96 is formed extending in a stripe shape along the center upper surface of the n-GaAs substrate 91.

An insulating layer 97 is formed on the upper side of the n-GaAs substrate 91, on a section extending from the side on both sides of the ridge 96 to the edge of the n-GaAs substrate 91. A p-electrode 98 is formed spanning over the ridge 96 and the insulating layer 97. This p-electrode 98 is formed from an underlayer electrode 99, and a plating film 100 stacked on the underlayer electrode 99. The upper surface of the p-contact layer 95 is exposed on the upper surface of the ridge 96 so that the p-contact layer 95 and the p-electrode 98 are an electrically connected structure. An n-electrode 101 is formed on the lower side of the n-GaAs substrate 91. This n-electrode 101 includes an underlayer electrode 102, and a plating film 103 stacked on the underlayer electrode 102.

Though the real index guided (structure) laser diodes shown in FIG. 24 and FIG. 25 are effective from the point of view of reducing the driving current, in the buried heterostructure laser diode shown in FIG. 24 with a current blocking layer having low light absorption; and the ridge structure laser diode shown in FIG. 25 covered only by a ridge structure whose dielectric film does not absorb light, the following problems were found to occur in applications where these laser diodes were used for example in levelers or markers.

In the laser diodes with a ridge structure in FIG. 23 through FIG. 25, the current injected into the ridge expands to both sides of the ridge, flows in the active layer section on the outer side of the active layer section facing the ridge, and emits electroluminescent light. In the real index guided structure laser diode shown in FIG. 24 and FIG. 25, this electroluminescent light propagates centered around the active layer with high refractive index without any significant light absorption loss, and is emitted externally from the end of the laser diode. The horizontal shape of the FFP (far-field pattern) consequently becomes distorted (or warped) into a FFP Gaussian shape as shown in FIG. 10B or a waveform with a fine wave shape called a ripple appears.

FIG. 11B is a concept drawing showing the FFP107 that appears as an elliptical shape when the laser beam 105 emitted from the semiconductor laser apparatus 104 containing a real index guided laser diode, is projected onto the screen 106. In the case where the laser diode generates a ripple, a projected image with a wave shape appears on the outer side of the elliptical FFP107 along the horizontal direction of the FFP107 appearing on the screen 106.

If this laser diode is used as a light source for levelers or markers, then the laser beam that is emitted can be passed through a lens and obtained as nearly a parallel beam. However, when electroluminescent light is emitted, then a wave shaped image of the electroluminescent light appears on the target object such as the screen causing distortion in the image projected by the laser beam.

FIG. 12B is a drawing showing problems when using the semiconductor laser apparatus 104 in a leveler. In FIG. 12B, a leveler 108 contains a semiconductor laser apparatus 104. A lens 109 adjusts the laser beam 105 emitted from the semiconductor laser apparatus 104 in a vertical direction extending a one ray (line) 110 projected onto a screen 106. The elliptical shape in the lower part of the figure shows a ray (line) 110 which is an enlarged view of the leveler output line. This ray (line) 110 is used for example as a height reference line. Note that the line 110 within the ovoid is actually extending in a vertical direction although the line is horizontal in the figure.

Enlarging the line 110 appearing on the screen 106 observed when the semiconductor laser apparatus 104 contains a laser diode where ripple occurs, shows multiple tiny lines at the top and bottom or broken or blurred lines. Examining the projected image shows problems such as that the ray (line) 110 has expanded along the width, or that the boundary has become unclear, so that one can no longer clearly identify the reference line position.

This invention has the object of providing a real index guided structure laser diode and fabrication process that causes no distortion in the horizontal shape of the far field pattern (FFP).

Another object of this invention is to provide a real index guided structure laser diode and fabrication process that causes no distortion in the projected image of the display device such as the leveler or marker.

An object of this invention is to provide a laser diode and fabrication process capable of achieving a reduction in the driving current.

An object of this invention is to provide a laser diode and fabrication process capable of attaining higher light emission efficiency.

This invention along with other objectives and unique features will become apparent to one skilled in the art from the description in the specifications and the attached drawings.

A simple description of the main aspects of the invention as related in these specifications is as follows.

(1) A laser diode of one aspect of this invention includes:

a square semiconductor substrate made from a first conductive type semiconductor, and including a first surface and a second surface as the side opposite the first surface, and a multiple epitaxial layer formed by successively forming a first cladding layer, an active layer, a second conductive cladding layer and second conductive contact layer on at least the first surface of the semiconductor substrate, and a ridge formed in a stripe shape from one pair of ends to the other ends along the semiconductor substrate by selectively etching from the upper surface of the second conductive contact layer to a specified thickness on the second conductive cladding layer, and an insulating layer deposited on the first surface side of the semiconductor substrate and formed on a section from the side surface of the ridge to the periphery of the semiconductor substrate, and a second electrode formed on the insulating layer over the second conductive contact layer of the ridge, and a first electrode formed on the second surface of the semiconductor substrate, and the semiconductor substrate structure contains bandpass energy serving as an absorption layer for light on a wavelength emitted from the active layer, or a structure where refractive index values for all semiconductor layers between the active layer and the semiconductor substrate are larger than the semiconductor substrate refractive index values, and grooves whose depth from the second conductive cladding layer exceeds the active layer are formed on one side between both ends of the ridge, from the second conductive cladding layer position along the end and also separated a specified distance from the side edge of the ridge, to the side position of the active layer, and the grooves are covered by an insulating layer.

Moreover, a coating film is formed on one end of the ridge, and a fact coating film is formed on the other end whose reflectivity is larger than or equal to the coating film on that (first) end of the ridge. There is a distance of 3 to 50 micrometers between the one side of the ridge and the side of the groove. The groove width is 1 to 50 micrometers. The distance from the side of the ridge to the end of the groove is 1 to 15 micrometers. In the deepest section of the groove, the upper edge of the insulating layer formed on the groove is at a position deeper than the lower edge of the active layer. The exposed section of the active layer on the groove inner circumferential surface gradually narrows to an oblique surface by the groove width towards the deeper section of the groove. In the laser diode, the semiconductor substrate is a structure containing bandgap energy that functions as a light absorbing layer to absorb light on a wavelength emitted from the active layer. This semiconductor substrate is a GaAs substrate, and the first conductive cladding layer is made from AlGaInP. The active layer is a single layer structure made from (Al) GaInP or is a multiple quantum well structure made from AlGaInP where the quantum well is GaInP and a quantum barrier made from AlGaInP. The second conductive cladding layer is made from AlGaInP, and the second conductive contact layer is made from GaAs with a lasing (light emission) wavelength from 600 to 690 nanometers.

The fabrication method of this type of laser diode includes:

(a) a process for preparing a first conductive type semiconductor substrate containing a first surface, and a second surface forming the side opposite the first surface, and multiple square laser diode forming regions arrayed width and lengthwise on the first surface, (b) a process for forming in sequence by metal-organic chemical vapor deposition: a first conductive cladding layer from a first conductive type semiconductor layer on the first surface of the semiconductor substrate, an active layer from the semiconductor substrate, a second conductive cladding layer from the second conductive type semiconductor layer and a second conductive contact layer from the second conductive type semiconductor layer, (c) a process for forming a ridge by selectively removing the semiconductor layers on the first surface of the semiconductor substrate, to form a stripe ridge along the center of the consecutive laser diode forming regions arrayed one-dimensionally and in a thickness from the upper surface of the exposed side of the second conductive contact layer to the center of the second conductive cladding layer, (d) a process for forming a groove in each square shaped laser diode forming region, on one of a pair of first sides along a direction intersecting the ridge, and at a position isolated a specified distance away from the ridge on the inner side of one side to a pair of second sides intersecting the pair of first sides, and deeper than the depth from the second conductive cladding layer to the active layer, (e) a process for forming an insulating layer on each laser diode forming region, by exposing the second conductive contact layer for exposure along the center of the ridge, and also forming the insulating layer to cover the first side of the remaining semiconductor substrate, (f) a process for forming a second electrode over the second conductive contact layer and also to selectively cover the insulating layer on each laser diode forming region, (g) a process to remove a specified thickness of the second surface on the semiconductor substrate, (h) a process for forming a first electrode on the second surface of the semiconductor substrate on each laser diode forming region, (i) a process for forming short strips (bars) by cleaving the semiconductor substrate at each first side on the laser diode forming region, (j) a process for forming a front coating film on the cleaved surface in the vicinity of the groove of the short strip and, forming a rear coating film whose reflectivity is larger than or equal to the coating film on the cleaved surface far from the groove of the short strip, and (k) a process for separating the short strips (bars) respectively at the second side of the laser diode forming region.

In the above process (d), along with forming the groove at an inner position 3 to 50 micrometers away from the inner side of one of the first sides; the groove edge is formed 1 to 15 micrometers from the side of the ridge. In this process (d), the exposed inner circumferential surface of the active layer on the inner circumferential surface of the groove, forms an oblique surface as the groove width gradually narrows and deepens. In the forming the groove in process (d) and forming the insulating layer in process (e), the upper edge of the deepest section of the insulator layer formed in the bottom of the groove, is deeper than the lower edge of the active layer. Moreover, the semiconductor substrate in the laser diode is a structure containing bandgap energy that functions as a light absorbing layer to absorb light on a wavelength (lasing wavelength) emitted from the active layer. In order to attain a lasing wavelength from 600 to 690 nanometers, in the above process (a), a GaAs substrate is prepared as the semiconductor substrate and, in the above process (b), a first conductive cladding layer is formed from AlGaInP, and the active layer is a single layer structure made from (Al)GaInP or is a multiple quantum well structure where the quantum well is GaInP and the quantum barrier is made from AlGaInP. The second conductive cladding layer is made from AlGaInP, and the second conductive contact layer is made from GaAs.

(2) A laser diode of the above aspect (1) is characterized in that the active layer is a single layer structure made from InGaAsP or is a multiple quantum well structure made from AlGaInP where the quantum well is InGaAsP and the quantum barrier is made from AlGaInP.

In the fabrication process for this laser diode of the above aspect (1), in the above process (a), a GaAs substrate is prepared as the semiconductor substrate and, in the process (b) is fabricated by forming a first conductive cladding layer from AlGaInP, and forming an active layer with a single layer structure made from InGaAsP or a multiple quantum well structure made from AlGaInP where the quantum well is InGaAsP and the quantum barrier is made from AlGaInP, and forming a second conductive cladding layer from AlGaInP, and forming a second conductive contact layer from GaAs.

(3) A laser diode of the above aspect (1) is characterized in that refractive index values for all semiconductor layers between the active layer and the semiconductor substrate are larger than the semiconductor substrate refractive index values, and the semiconductor substrate is a Ga (As) P substrate, and the first conductive cladding layer is made from AlGaInP, and the active layer is a single layer structure made from (Al)GaInP or is a multiple quantum well structure where the quantum well is GaInP and the quantum barrier is made from AlGaInP, and the second conductive cladding layer is made from AlGaInP, and the second conductive contact layer is made from GaAs with a lasing (light emission) wavelength from 560 to 640 nanometers.

In the fabrication process for this laser diode of the above aspect (1), a Ga(As)P substrate is prepared as the semiconductor substrate in the above process (a), and in the process (b), a first conductive cladding layer is formed from AlGaInP, and an active layer is a single layer structure made from InGaAsP or a multiple quantum well structure where the quantum well is GaInP and the quantum barrier is made from AlGaInP, and a second conductive cladding layer is formed from AlGaInP, and a second conductive contact layer is formed from GaAs.

(4) A laser diode of one aspect of this invention is a buried heterostructure laser diode including:

a square semiconductor substrate made from a first conductive type semiconductor, containing a first surface and a second surface forming the side opposite the first surface, and a multiple epitaxial layer is made by sequentially forming semiconductor layers including at least a first conductive cladding layer, an active layer, a second conductive cladding layer and second conductive contact layer, formed on at least the first surface of the semiconductor substrate, and a ridge formed in a stripe shape from one pair of ends to the other ends along the semiconductor substrate by selectively etching from the upper surface of the second conductive cladding layer to a specified thickness on the second conductive cladding layer, and a first current blocking layer pair formed from a first conductive type semiconductor layer enclosing the ridge, and formed on the second conductive cladding layer remaining on both sides of the ridge, and a second conductive contact layer made from the second conductive type semiconductor layer formed on the current blocking layer and the ridge, and a second electrode formed over the second conductive contact layer, and a first electrode formed over the second surface of the semiconductor substrate, and the first conductive current blocking layer is a structure containing bandgap energy transparent to light on the lasing wavelength of the active layer, and grooves whose depth from the second conductive cladding layer exceeds the active layer are formed on one side between both ends of the ridge, from the second conductive cladding layer position along the end and also separated a specified distance from the side edge of the ridge, to the side position of the active layer, and the grooves are covered by an insulating layer, and the second electrode overlaps the insulating layer in the groove section.

The semiconductor substrate is a GaAs substrate, the first conductive cladding layer is made from AlGaInP, the active layer is a single layer structure made from (Al)GaInP or is a multiple quantum well structure where the quantum well is GaInP and a quantum barrier is made from AlGaInP, the second conductive cladding layer is made from AlGaInP, the first conductive current blocking layer is made from Al(Ga)InP, and the second conductive contact layer is made from GaAs.

The effects rendered by the typical aspects of this invention disclosed in this specification are briefly described next.

A first aspect (1) of the invention is capable of providing a real index guided structure laser diode that does not generate distortion in the horizontal shape of the (a) far-field pattern (FFP). In other words, the scattered light (emitted in vicinity of ridge) and electroluminescent light (mainly emitted in external section of waveguide) emitted in the internal section of the laser diode is conveyed centering around the highly refractive active layer, reaches the front facet (forward emission) and back facet (rear emission) and is emitted externally. In the laser diode, the groove extending from the surface (upper surface) of the multiple epitaxial layer to a depth deeper than the active layer, is formed near the end of the front facet side as a structure for cleaving the active layer. Also, an insulating layer covers the surface of the groove. This groove can therefore block excess scattered light and electroluminescent light so that no electroluminescent light is discharged from the front facet to outside the laser diode, and effects from electroluminescent light leaking into the projected light image of the laser beam which is a nearly parallel beam due to the lens, can be prevented.

Therefore problems occurring due to scattering or distortion in the image projected by the laser light can be prevented in cases where utilizing the laser diode of this invention as a light source for display devices such as levelers and markers that are major applications for laser diodes in the visible light range. Even if using the laser light emitted from the rear facet, the light intensity is detected as monitor light so that no problems occur due to scattered light and electroluminescent light.

The laser diode with groove in this invention is a real index guided structure laser diode and therefore possesses higher slope (light emission) efficiency and a lower driving current than the loss guided structure laser diode. Namely, the real index guided ridge type laser diode offers improved slope efficiency since there is no material in the current blocking layer to absorb light. This type of laser diode can therefore operate with a low driving current. Moreover, the groove in the laser diode of this invention prevents electroluminescent light from being emitted externally and so can achieve a beam quality equivalent to loss guided structure laser diodes using the conventional GaAs buried layer. Consequently, using the ridge type laser diode with groove of this invention in display devices such as levelers and markers achieves superior display devices in terms of both beam efficiency and long term drive.

Compared to the first (1) aspect, the second aspect (2) is a structure where only the material of the active layer was changed and also possesses a groove on the front facet (forward emission) side and can therefore achieve a laser diode capable of suppressing electroluminescent light from the front facet the same as in the invention of the first (1) aspect. The second aspect (2) is therefore a laser diode ideal as a light source for display devices such as levelers and markers.

The third (3) aspect is a structure where all refractive index values in the semiconductor layer among the active layer and semiconductor substrate are larger than the refractive index of the semiconductor substrate and therefore electroluminescent light propagates through active layers and semiconductor layers having high refraction, and therefore along with the effect provided by the groove, yields a satisfactory FFP (far-field pattern) with no electroluminescent light emissions outside the front facet.

The fourth (4) aspect is a buried heterostructure laser diode structure where a groove is Namely, a groove is formed along the end surface of the front facet side, and also from the second conductive contact layer at a specified distance from the ridge edge, to a position reaching the side edge of the active layer, and at a depth from the second conductive contact layer exceeding the active layer depth. Moreover this groove is covered by an insulating layer. This structure provides a laser diode capable of suppressing electroluminescent light from the front facet the same as in the invention of the first (1) aspect. This fourth aspect (4) is therefore a laser diode ideal as a light source for display devices such as levelers and markers.

BRIEF DESCRIPTION OF THE DRAWINGS

FIG. 7B is a cross sectional view showing the process for cleaving to form the multiple bars during the fabrication of the laser diode of the first embodiment;

DETAILED DESCRIPTION OF THE PREFERRED EMBODIMENTS

Figure 1:
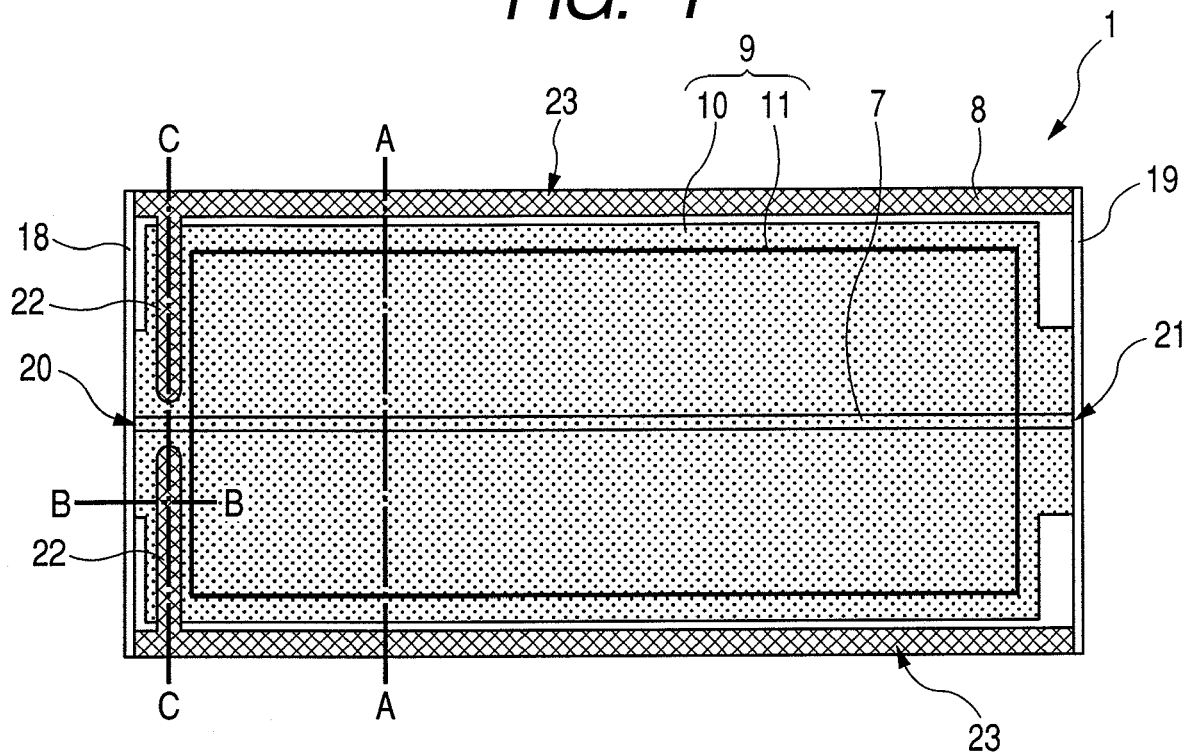
FIG. 1 is a flat diagrammatic view of the laser diode of the first embodiment of this invention.

The embodiment of this invention is described next while referring to the drawings. In all drawings, the same reference numerals are used for the same functions and a repeated description of those same functions is omitted.

First Embodiment

In the first embodiment, this invention is described by utilizing a 630 nanometer red semiconductor laser (red laser). FIG. 1 through FIG. 12 are drawings relating to the laser diode of the first embodiment of this invention. FIG. 1 through FIG. 4 are drawings relating to the structure of the laser diode. FIG. 5 through FIG. 7 are drawings relating to the manufacturing method (fabrication process) of the laser diode. FIG. 8 through FIG. 12 are drawings showing the effect of the laser diode. In the laser diode described in the first embodiment, the first conductive type (material) is the n-type, and the second conductive type is the p-type.

The laser diode structure is shown in FIG. 1 through FIG. 4. FIG. 1 is a flat diagrammatic view of the laser diode. FIG.

Figure 3:
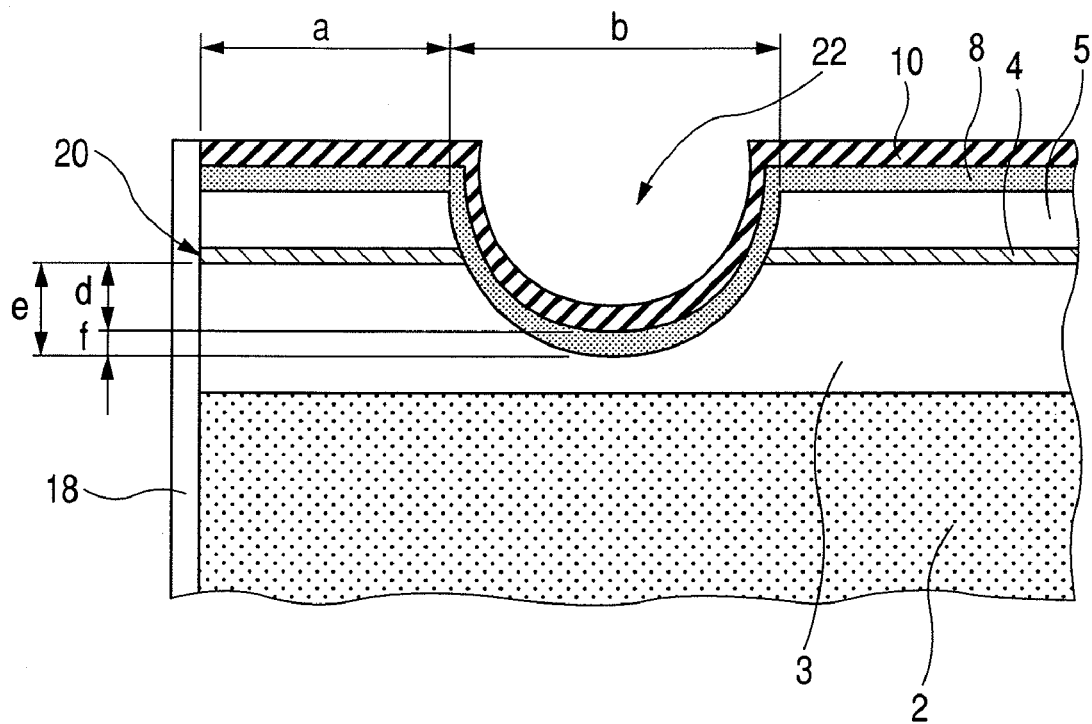
FIG. 3 is a cross sectional view taken along lines B-B.
Figure 4:
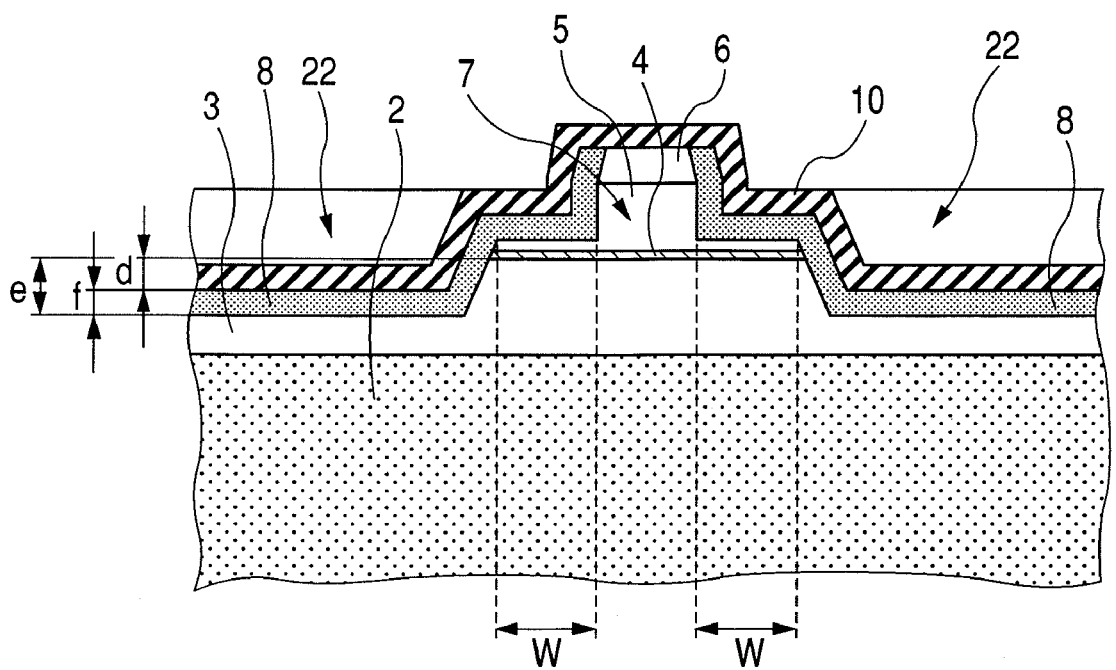
FIG. 4 is a cross sectional view taken along lines C-C.

2 is a cross sectional view taken along lines A-A in FIG. 1. FIG. 3 is a cross sectional view taken along lines B-B of FIG. 3. FIG. 4 is a cross sectional view taken along lines C-C of FIG. 4. The laser diode is referred to by the term semiconductor laser chip or simply, chip.

Figure 2:
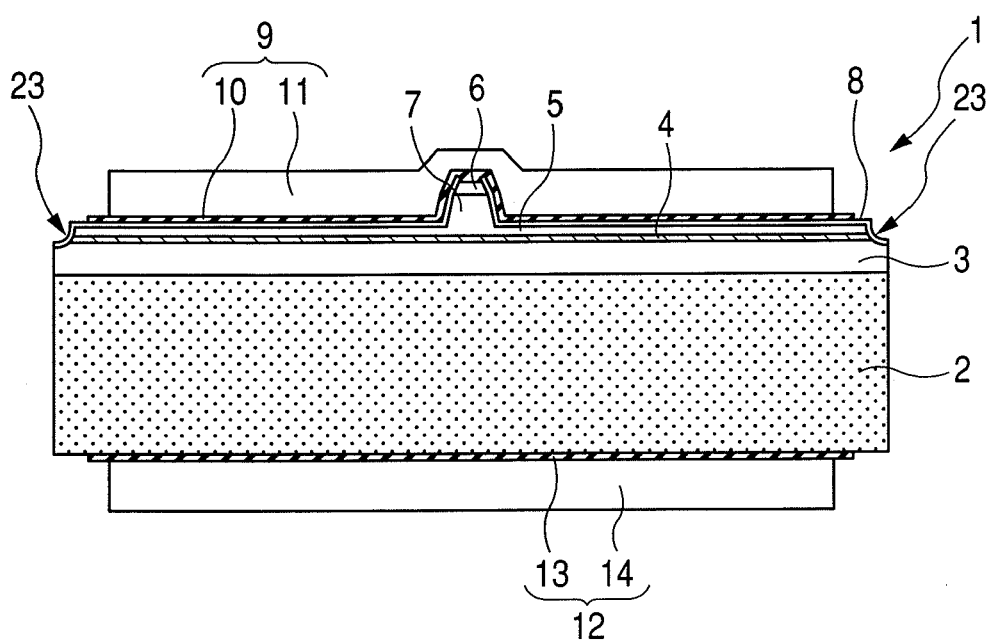
FIG. 2 is a cross sectional view taken along lines A-A.

A laser diode 1 is formed on a semiconductor substrate 2 as the base as shown in FIG. 2. This semiconductor substrate 2 may for example be an n-type GaAs substrate. The laser diode 1 structure includes a first conductive cladding layer (n-cladding layer) 3 of AlGaInP formed on a first surface (upper surface in FIG. 2) of this n-GaAs substrate 2, an active layer 4 formed from a multiple quantum well structure (MQW), a second conductive cladding layer (p-cladding layer) 5 formed from AlGaInP, and a second conductive contact layer (p-contact layer) 6 made from GaAs; all formed in stacked layers by MOCVD (metal-organic chemical vapor deposition).

The active layer 4 is an MQW structure made from a quantum barrier (barrier layer) formed from an AlGaInP layer, and a quantum well (well layer) formed from an GaInP layer. The well layer for example may be three layers that are five nanometers thick, and the barrier layer may be four layers that are six nanometers thick. The active layer 4 may also be a single layer structure made from (Al) GaInP.

One ridge 7 is formed in the center of the first surface on n-GaAs substrate 2, extending in a stripe shape from a pair of ends facing the n-GaAs substrate 2. This ridge 7 is formed by selectively etching material from the upper surface of p-contact layer 6 to a specified depth on the p-cladding layer 5. The ridge 7 is formed extending in a straight line.

Both side of the laser diode 1 are etched in a mesa shape from the upper surface of the p-cladding layer 5 past the active layer 4 and into the n-cladding layer 3. This mesa shaped section is formed by cutting a isolating groove 23 with a u-shaped cross section in that center section.

An insulating layer 8 is formed over the first surface side of the n-GaAs substrate 2. This insulating layer 8 is formed covering the side surfaces of the ridge 7, and also from the side surfaced to the periphery (including side edges and end edges) of the n-GaAs substrate 2. Therefore, the upper surface of the ridge 7 positioned between the pair of insulator layers 8 or in other words, the upper surface of the p-contact layer 6 is exposed from the insulator layer 8. The insulating layer 8 is formed from a dielectric layer such as $SiO_2$, or $SiN_x$, etc.

The p-electrode 9 is formed on the insulating layer 8 as shown in FIG. 1. This p-electrode 9 includes an underlayer electrode 10 formed on the insulating layer 8, and a plating film 11 formed over this underlayer electrode 10. The underlayer electrode 10 is formed in the section formed by dots in FIG. 1 and the plating film 11 is shown by the rectangular section formed by a solid line.

The n-electrode 12 is formed over the second surface (lower surface in FIG. 2) side of the n-GaAs substrate 2. The n-electrode 12 includes an underlayer electrode 13 formed on the n-GaAs substrate 2, and a plating film 14 formed over this lower electrode 13.

The section of the active layer 4 almost directly below the ridge 7 forms a resonant cavity (optical waveguide). Both facets (emission surfaces) of this resonant cavity each emit laser light. As shown in FIG. 1, a coating film 18 with a reflectivity rate of 30 percent is formed on one emission surface, and a coating film 19 with a reflectivity rate of 93 percent is formed on the other emission surface (or facet). The coating film 18 is a single layer but the coating film 19 is made of multiple layers (for example four layers). The emission surface where the coating film 18 is formed is the front facet 20 (forward emission side), and the emission surface where the coating film 19 is formed is the rear facet 21 (rear emission side).

The end of the plating film 11 forming the p-electrode 9 is formed at a position slightly (for example 30 micrometers) away from the rear facet 21 and the front facet 20.

As shown in FIG. 1 on the other hand, one characteristic of this invention is a pair of grooves 22 parallel with the front facet 20 and also enclosing the ridge 7, that are formed in identical straight lines. As shown in FIG. 4, the grooves 22 are formed at a position separated by a distance w on both sides of the ridge 7 and up to both sides of the n-GaAs substrate 2 as shown in FIG. 1. The grooves 22 are formed in straight lines in a width b at a position within a distance a, from the front facet 20 as shown in FIG. 3.

In this embodiment, the distance a between the front facet 20 (end side) and the side of the groove 22 is for example 3 to 50 micrometers and here 20 micrometers. The width b of groove 22 may be 1 to 50 micrometers and here for example is 10 micrometers.

The upper limit and lower limit of the groove width b are determined by the following reasons. The lower limit of the groove width is determined by the accuracy of the laser diode fabrication process. In the typical process, the groove width must be at least one micrometer in order to form a uniform groove with no cutoffs. There is no particular boundary established for the upper limit however when just the ridge section length is protruding too much, then ridge notches tend to occur which causes a drop in laser diode production so a groove width upper limit of about 50 micrometers is set as a general guide.

The groove 22 surface is covered by an insulating layer 8 formed from a dielectric layer 8 such as $SiO_2$, or $SiN_x$, etc. An underlayer electrode 10 forming a p-electrode 9 is formed on the insulating layer 8 on the groove 22. The plating film 11 making up the p-electrode 9 is at a position separated from the groove 22. The isolated position is used for separating the structure from the groove 22 in order to make patterning easier in the photo resist process during forming of the Au (gold) plating. However a structure where the plating film 11 covers the upper section of the groove 22 may also be used.

If the distance a between the front facet 20 and side edge of groove 22 is smaller then 3 micrometers then position deviations tend to easily occur during the cleaving to form the resonant cavity (facet) of the laser which makes it difficult to obtain a stable cleaved surface with no steps. If the distance a between the front facet 20 and side edge of groove 22 is larger than 50 micrometers, then electroluminescent light occurring between the front facet 20 and the groove 22 positions, tends to be emitted outside the diode so the groove 22 position is set to less than 50 micrometers from the edge.

A distance of 1 to 15 micrometers for example is used as the distance w between the side edge of the ridge 7 and the inner edge (inner side) of groove 22 and here for example is 10 micrometers. The light intensity of the position at the inner edge of the groove 22 must be set below a peak value of $1/e^2$ (Here, e is the Euler's constant.) of the guided mode light intensity (distribution). Namely, when the groove 22 inner end position is near the ridge 7, and the light intensity at the edge of the groove becomes larger than a peak value of $1/e^2$, then the groove blocks that guided mode so that light scattering occurs. This light scattering causes the problem that an interference pattern is generated in the emitted laser beam that lowers the beam quality. Therefore, one micrometer is selected as a minimum value for the distance w, that is within the peak value of $1/e^2$ of the guided mode light intensity distribution.

However when this distance w is larger than 15 micrometers, so that the ridge 7 is farther from the inner side of groove 22, then electroluminescent light escaping from the gap between the ridge 7 and groove 22 is emitted from the front facet 20, and this electroluminescent light appears visually in the image projected by the laser beam. If the groove position is kept within 15 micrometers then there is no drop in beam quality since the electroluminescent light is hidden from the image projected by the beam even if electroluminescent light leaks from the gap and is emitted from the front facet 20.

The cross section of the groove 22 shown in FIG. 3 is preferably formed so that electroluminescent light generated between groove 22 and rear facet 21 does not scatter and recombine in the active layer 4 opposite the side blocked by groove 22, or that the light does not return again to the active layer 4 between the groove 22 and the rear facet 21. The edge of the active layer 4 is therefore preferably formed as an oblique surface so that it does not accept or reflect light appearing on the surface (inner circumferential surface) where the active layer 4 is cut by the groove 22 as shown in FIG. 3. Therefore in this embodiment, the section where the active layer 4 is exposed on the inner circumferential section of groove 22, forms an oblique surface as the width of groove 22 becomes gradually narrower as it becomes deeper.

As shown in FIG. 3 and FIG. 4, if d is made larger than 0, then light can be prevented from crossing the active layer 4 and accepted and received on the active layer 4, even if the edge of active layer 4 appearing at the inner circumferential surface of groove 22 is perpendicular to the first surface of the n-GaAs substrate 2. The d indicated in FIG. 3 and FIG. 4 in the deepest section of groove 22, is the distance between the lower edge of active layer 4 and the upper edge of insulating layer 8 formed on the inner circumferential surface of groove 22. This groove 22 exceeds the active layer 4 (depth) but in this case an exchange of light can be prevented, if the distance e between the lower edge of active layer 4 and the deepest bottom of groove 22 is formed larger than the thickness f of insulating layer 8.

The laser diode 1 in the first embodiment is a structure containing bandpass energy that serves as an absorption layer for light on a lasing (light emission) wavelength (630 nm) in the active layer 4 of semiconductor substrate 2. To make this structure, the semiconductor substrate is formed from GaAs substrate, the first conductive cladding layer (n-cladding layer) 3 is made from AlGaInP, the active layer 4 is a multiple quantum well structure where the quantum well is GaInP and the quantum barrier is made from GaInP, and a second conductive cladding layer (p-cladding layer) 5 made from AlGaInP, and the second conductive contact layer (p-contact layer) 6 is formed from GaAs. The semiconductor laser diode 1 is for example a width of 200 micrometers, a length of 600 micrometers, and a height of 100 micrometers.

The process for fabricating the laser diode 1 of the first embodiment is described next while referring to FIG. 5 through FIG. 7. The views in FIG. 5 through FIG. 7 are drawings showing the semiconductor substrate in each process for fabricating the laser diode.

First of all, a semiconductor substrate (n-GaAs substrate) 2 made from first conductive type (n-type) GaAs including a first surface and second surface opposite the first surface is prepared. This n-GaAs substrate 2 is about 450 micrometers thick. This n-GaAs substrate 2 is subjected to each process and sections made up of multiple diode lasers are arrayed on the first side of the n-GaAs substrate 2. This square section for forming one laser diode is called the product forming section to make the description simpler. In the final production step, the n-GaAs substrate 2 is cleaved on one side of the product forming section into a short strip (bar), and then cleaved on an intersecting side of the product forming piece to form a single laser diode. The n-GaAs substrate 2 prior to cleavage is also called a wafer.

On the X and Y planes of the n-GaAs substrate 2, the direction where the resonant cavity (optical waveguide) extends is the Y direction. The laser diode 1 is 200 micrometers wide and 600 micrometers long so the length in the X direction of the product forming section is length added with a cutting margin of 200 micrometers, while the length in the Y direction is 600 micrometers on account of the particle cleavage. In FIG. 5 through FIG. 7, each figure shows a single product forming section except for the drawings in FIG. 5B, FIG. 5D, FIG. 7B and FIG. 7C. FIG. 5B and FIG. 7B shows the X direction and the Y direction.

Figure 5A:
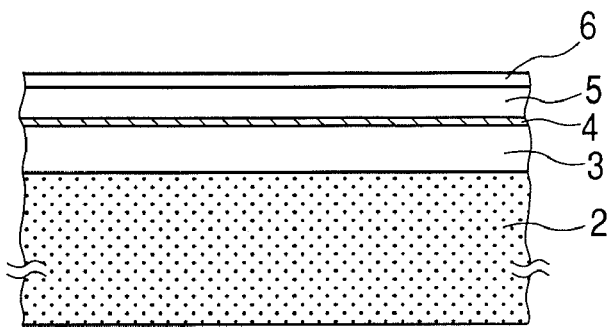
FIG. 5A is a cross sectional view showing the process for forming the multiple epitaxial layer during fabrication of the laser diode of the first embodiment.
Figure 5B:
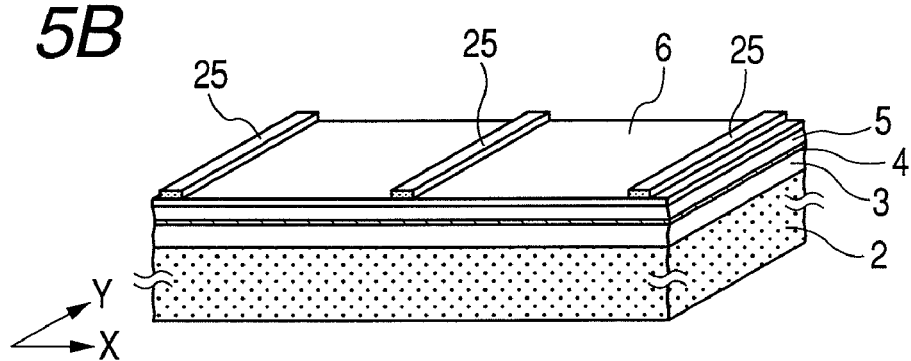
FIG. 5B is a cross sectional view showing the process for forming the etching mask during fabrication of the laser diode of the first embodiment.

As shown in FIG. 5A, after preparing the n-GaAs substrate 2, a multiple epitaxial layer is formed on the first surface of the n-GaAs substrate 2 by the MOCVD method. The multiple epitaxial grown layers are made up of a sequentially formed n-cladding layer 3 from AlGaInP that is 1.8 micrometers thick, an active layer 4 made from a multiple quantum well structure (MQW), a p-cladding layer 5 made from AlGaInP that is 1.8 micrometers thick, and a p-contact layer 6 made from GaAs that is 0.5 micrometers thick.

As shown in FIG. 2, the active layer 4 as described above is a MQW structure formed from a quantum well (well layer) 7 of GaInP layer, and a quantum barrier (barrier layer) 6 of AlGaInP layer. This well layer 7 is three layers. The active layer 4 is made up of an MQW structure formed from a quantum well (or well layer) made of GaInP layer, and a quantum barrier (barrier layer) made from an AlGaInP layer. The quantum well here is three layer with a film thickness of 5 nanometers, and the quantum barrier is four layers with a thickness of 6 nanometers. This active layer 4 may also be a single layer structure made from (Al) GaInP.

In this embodiment, the n-GaAs substrate 2 is a multiple epitaxial grown layer structure containing bandgap energy serving as an absorption layer for absorbing light on the active layer lasing wavelength (630 nanometers).

Next, after forming the thermal oxidation film (SiO2 film) by the CVD (chemical vapor deposition) method across the entire surface of the first surface of n-GaAs substrate 2, patterning is performed in a stripe shape by using the photo resist process, and an etching mask 25 is formed as shown in FIG. 5B. This etching mask 25 is installed along the Y direction in the center of each product forming section. The width of this etching mask 25 is 500 nanometers thick and 2 micrometers wide.

Figure 5C:
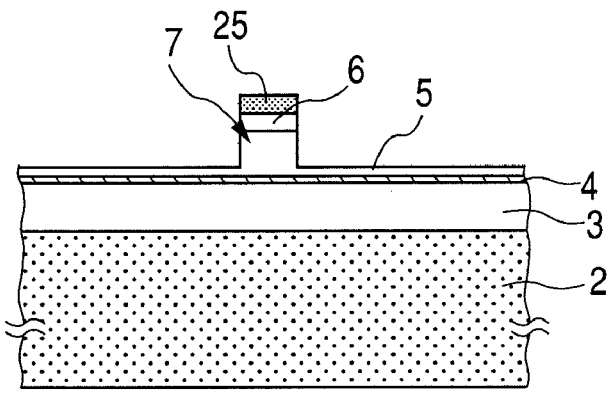
FIG. 5C is a cross sectional view showing the etching process during fabrication of the laser diode of the first embodiment.

As next shown in FIG. 5C, chemical etching with HCl type etchant or a dry etching process are utilized to etch from the p-contact layer 6 partway into the p-cladding layer 5 by utilizing the etching mask 25 as the mask. In the case of dry etching, an etchant containing $H_2O_2$ is used to etch the surface of p-contact layer 6 to approximately 0.1 micrometers in order to remove the surface of the damaged layer. After etching, the etching mask 25 is removed with HF type etchant. The ridge 7 is in this way formed with a 2 micrometer width.

Figure 5D:
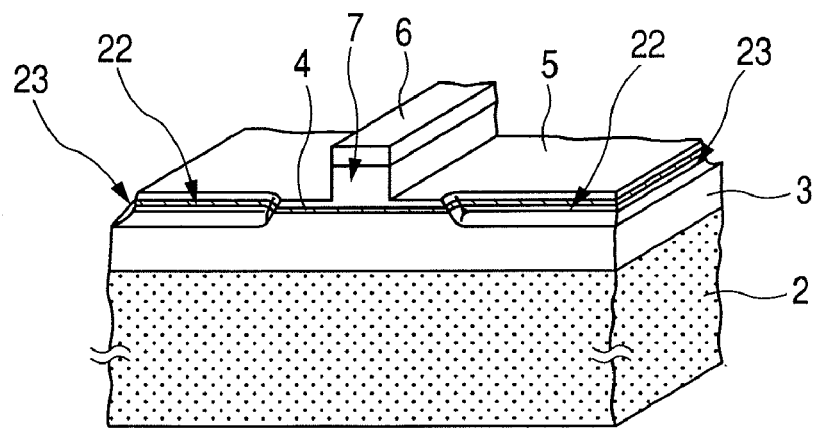
FIG. 5D is a cross sectional view showing the process for forming the groove during fabrication of the laser diode of the first embodiment.

Though not shown in the drawing a mask is selectively formed on the first side of the n-GaAs substrate 2. This mask is utilized as the etching mask to selectively etch the n-GaAs substrate 2 chemically using an isotropic etchant to form the groove 22 and the isolating groove 23 as shown in FIG. 5D. In the first embodiment, the groove 22 and the isolating groove 23 are formed simultaneously but may be fabricated in two separate processes in order to adjust the depth of each groove.

The isolating groove 23 is a groove with a U-shaped cross section and formed along both sides of the product forming section as well as along the Y direction of the wafer. This isolating groove 23 is cut along the center when dividing the product forming section. This isolating groove 23 is omitted from some drawings.

The groove 22 on the other hand, which is a characteristic feature of this invention, is formed along the inner side of one side in the Y direction of the square-shaped product forming section. This groove 22 is formed at a position separated by a distance w from the side edge of one adjoining ridge 7, to a position separated by a distance w from the side edge of the other adjoining ridge 7 (See FIG. 4.). Here, the distance w is selected as 10 micrometers as described previously. The groove 22 is formed from one side along the y direction of the product forming section to a position separated by a distance a as shown in FIG. 3. The distance a, is selected as 20 micrometers as described previously. The width b of groove 22 is selected as 10 micrometers as described previously.

The groove 22 is formed to a depth along the n-cladding layer 3 so as to cross the active layer 4. In this embodiment, the groove 22 is formed to a depth partway along the n-cladding layer 3 but may be formed to reach the n-GaAs substrate 2 without causing problems.

When the side of the groove 22 with the internal circumferential surface is formed to a surface perpendicular to the first surface of n-GaAs substrate 2, the light propagated within the laser is reflected from the side surfaces of groove 22, and causes interference by returning back to the ridge structure forming the waveguide for the laser light. So to eliminate this interference it is important that the active layer exposed to groove 22 does not have a perpendicular side surface. In this embodiment, the groove 22 is formed chemically with an isotropic etchant so that an oblique surface (arc-shaped surface) is formed as both sides of the groove 22 become gradually narrower towards the deeper part of the groove. Consequently as shown in FIG. 3, the end surface of the active layer 4 can be exposed as an arc-shaped oblique surface to the inner circumferential surface side of the groove 22, and interference from the above described returning light is prevented since the end surface of the active layer 4 exposed to the groove 22 emits no returning light into the ridge structure.

An insulating layer 8 is next formed by the CVD method or the sputtering method across the entire first surface of the n-GaAs substrate 2. The insulating layer 8 on the upper surface of each ridge 7 is then removed by an etching method. In this way, a structure is formed where only the upper surface of the p-contact layer 6 made on the upper part of ridge 7 is exposed from the insulating layer 8. The insulating layer 8 is therefore formed among the ridges 7, from the side surface of one adjoining ridge 7 to the side surface of the other adjoining ridge 7. The insulating layer 8 is formed from a dielectric layer such as $SiO_2$, or $SiN_x$, etc. The thickness is for example 0.1 micrometers.

Also, important in the active layer 4 split by the groove 22 is that no light propagates via the insulating layer 8 covering the groove 22. The groove 22 is formed deeper than the active layer 4 but during forming of the groove 22 and insulating layer 8, the depth of groove 22 and the thickness of insulating layer 8 must be selected as shown in FIG. 3 and FIG. 4 so that the distance e between the lower edge of active layer 4 and the deepest part of groove 22 is thicker than the thickness f of insulating layer 8.

Figure 6A:
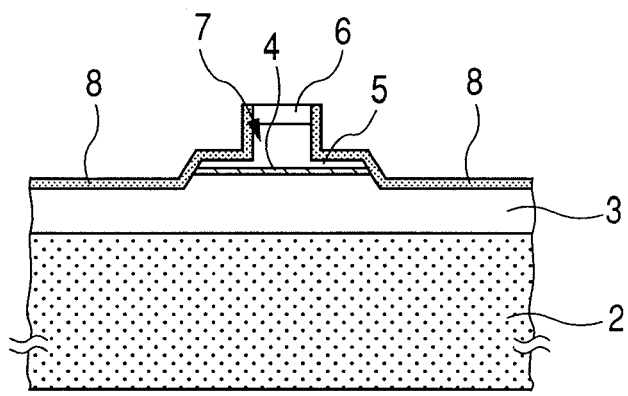
FIG. 6A is a cross sectional view showing the process for forming the insulating layer during fabrication of the laser diode of the first embodiment.
Figure 6B:
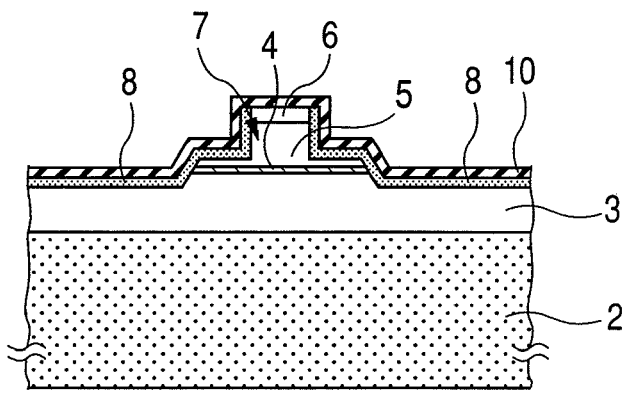
FIG. 6B is a cross sectional view showing the process for forming the underlayer electrode during fabrication of the laser diode of the first embodiment.

The underlayer electrode 10 is next formed on the ridge 7 and on the insulating layer 8 as shown in FIG. 6B. The underlayer electrode 10 is a structure for example of sequentially formed layers of titanium, platinum and gold, with a thickness of approximately 0.3 micrometers. In the laser diode size shown in FIG. 1, the product forming section matches the longitudinal dimensions (Y direction), and the width direction (X direction) is just larger plus the cutting margin for cutting the n-GaAs substrate 2. The dimensions of the underlayer electrode 10 gradually narrow in the cleavage section in the longitudinal direction (Y direction) as shown in FIG. 1, and formed continuously connected as a row in the product forming section. The underlayer electrode 10 however is a structure with product forming sections arrayed adjacently in the forward direction along the width (X direction) as shown in FIG. 1.

Figure 6C:
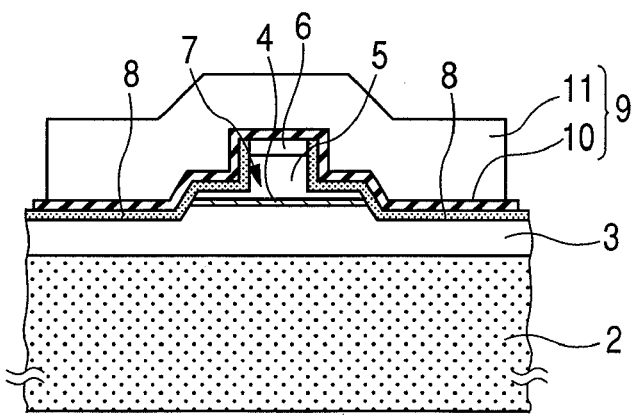
FIG. 6C is a cross sectional view showing the process for forming the plating film during fabrication of the laser diode of the first embodiment.
Figure 6D:
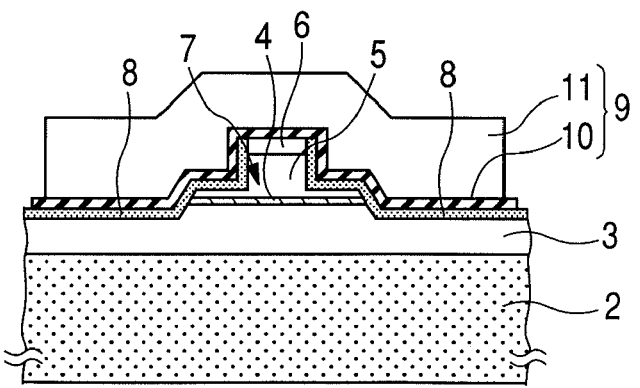
FIG. 6D is a cross sectional view showing the process for etching the second surface of the substrate during fabrication of the laser diode of the first embodiment.

Next, the plating film 11 is selectively formed on the underlayer electrode 10 as shown in FIG. 6C (See FIG. 1.). The plating film 11 is a gold plating that is 3 micrometers thick. The second surface (lower surface in the figure) of n-GaAs substrate 2 is next selectively removed to a specified thickness as shown in FIG. 6D to reach an overall thickness of approximately 100 micrometers.

Figure 7A:
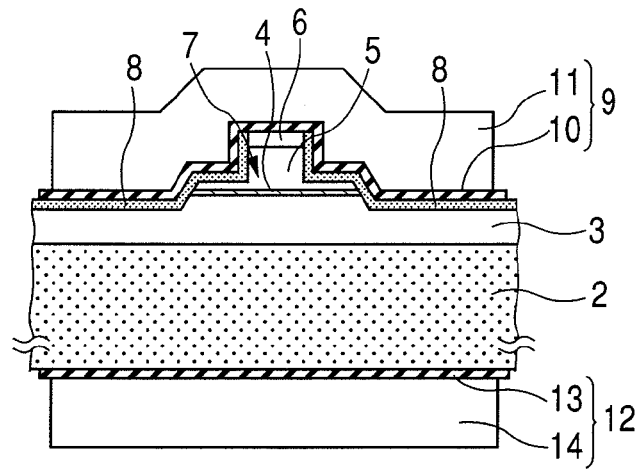
FIG. 7A is a cross sectional view showing the process for forming the n-electrode during fabrication of the laser diode of the first embodiment.
Figure 7B:
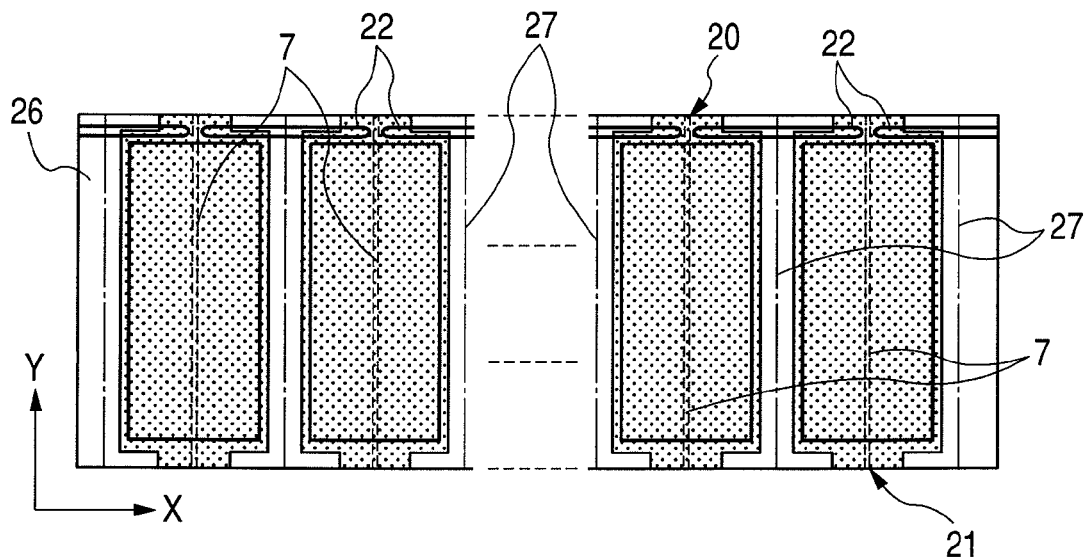
FIG. 7B is a cross sectional view showing the process for forming the multiple bars during the fabrication of the laser diode of the first embodiment.
Figure 7C:
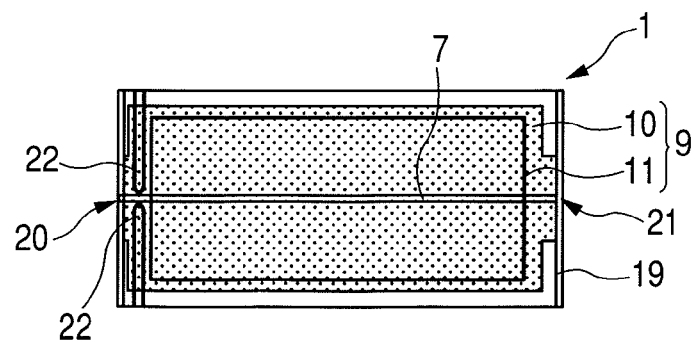

Next, an n-electrode 12 is formed on the second surface (lower surface in figure) of n-GaAs substrate 2 as shown in FIG. 7A. The n-electrode 12 contains an underlayer electrode 13 formed directly on the n-GaAs substrate 2, and a plating film 14 formed over the underlayer electrode 13. After sequentially forming AuGeNi, platinum and gold layers on the second surface of n-GaAs substrate 2, these layers are selectively etched at specified sections to form the underlayer electrode 13. The underlayer electrode 13 for example is about 0.9 micrometers thick. The plating film 14 is formed selectively on the underlayer electrode 13.

The n-GaAs substrate 2 is next cleaved at specified intervals (600 micrometers) in a direction (X direction) intersecting the direction (Y direction) that the ridge 7 extends. Multiple short strips (bars) 26 are formed in this way as shown in FIG. 7B. The drawing in FIG. 7B shows a single short strip 26. The upper side and the lower side in FIG. 7B are the respective cleaved surfaces. A groove 22 is also formed on the top side of the cleaved surface. The ridges 7 extend in a direction intersecting those cleaved surfaces. The cleaved surface on the side where the groove 22 is formed is the front facet 20. The other cleaved surface on the opposite side is the rear facet 21. The dotted line extending upwards and downwards in the figure is the cutting line 27. This cutting line 27 is cut during the singulation process. Though not shown in the drawing, an isolating groove 23 is formed in the cutting line 27 section.

Coating films making up the respective reflection coatings are next formed by the sputtering method on the cleaved surfaces on both sides of the short strips (bars) 26. A coating film 18 with a reflection rate of 30 percent is formed on the front facet 20, and a coating film 19 with a reflection rate of 93 percent is formed on the rear facet 21. The front facet coating film 18 is a single layer film but the rear facet coating film 19 is a multilayer film (for example four layers).

The short strips (bars) 26 are next cut on the cutting line 27 as shown in FIG. 7B, to fabricate the leaser diode 1 shown in FIG. 7C. A dicing plate or a scriber that makes a scratch and then causes a crack along that scratch is used to make the cut. During singulation (forming individual pieces) by inserting a scratch mark and the subsequent cracking, making the scratch is easy since the scriber can form a scratch along the center at the bottom of the isolating groove 23. This singulation process allows fabricating multiple laser diodes 1 as shown in FIG. 1 through FIG. 4.

A laser diode 1 was fabricated using the above described structure and fabrication process, and results from evaluating device characteristics showed that utilizing a ridge diode structure with high slope (light emission) efficiency, allowed reducing the driving current of the laser diode by 30 to 50 percent compared to conventional lasers with a buried GaAs structure. Also, a projection image equivalent to conventional products was obtained without causing a drop in the beam quality due to electroluminescent light emissions.

The embodiment renders the following effects.

Figure 10A:
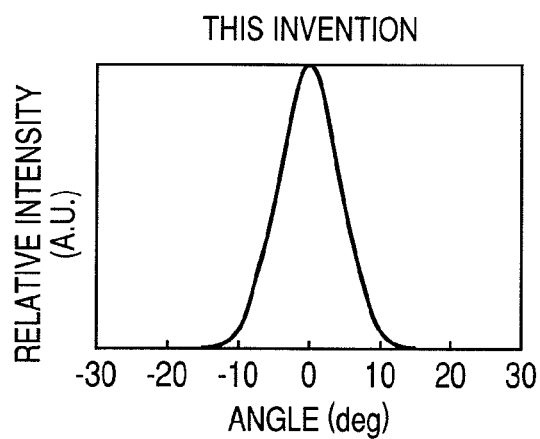
FIG. 10A is a graph showing the horizontal FFP shape of the laser diode.

(1) The laser diode 1 of the first embodiment is a real index guided structure ridge laser diode yet causes no light scattering in the horizontal shape of the far-field pattern (FFP) as shown in FIG. 10A. If using a real index guided structure laser diode of the related art, then the scattered light (emitted in vicinity of ridge structure) and the electroluminescent light (emitted mainly outside the optical waveguide) emitted inside the laser propagates along the center of active layers with a high refractive index, and is emitted externally from the front facet of the laser diode. This scattered light and electroluminescent light appears as distortion in part of the Gaussian shape of the FFP, or as a fine-shaped wave called a ripple as shown in FIG. 10. However, the laser diode 1 of the first embodiment, is a structure where a groove 22 extending from the surface (upper surface) of the multiple epitaxial growth layer to a depth exceeding the active layer 4, cuts the active layer 4 installed near the end surface of front facet 20. This groove 22 therefore blocks the excessive scattered light and electroluminescent light so that no electroluminescent light is emitted to outside the laser diode from the front facet 20. Consequently, the horizontal shape of the FFP for the laser diode 1 in the first embodiment is a Gaussian shape as shown in FIG. 10A containing no distortion such as ripple.

Figure 9A:
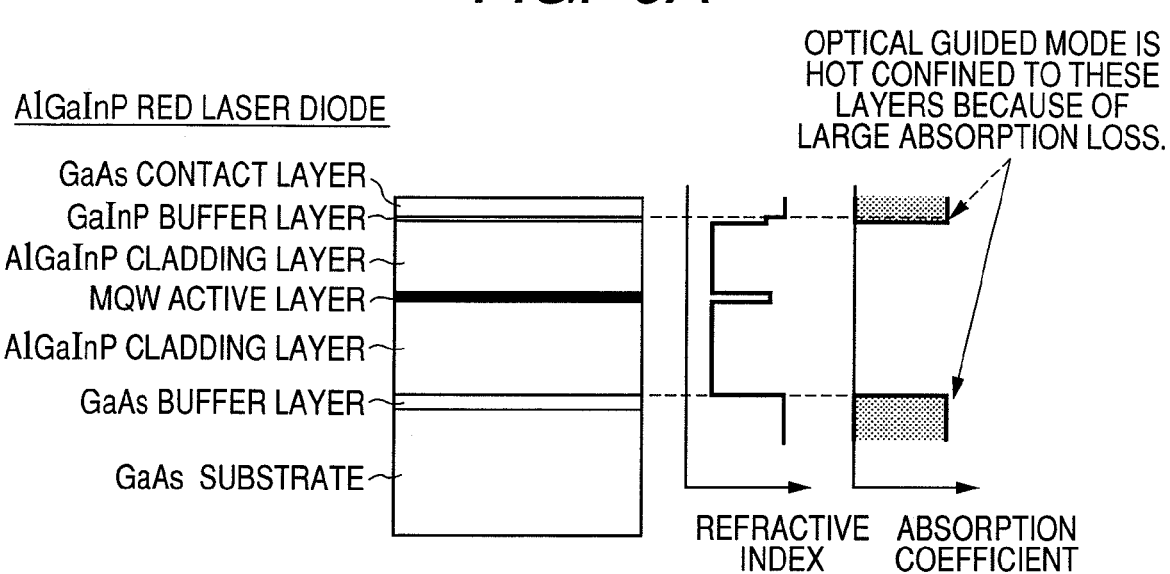
FIG. 9A is a drawing showing the composition of the multiple epitaxial layer (AlGaInP) of the laser diode, and the refractive index and absorption coefficient for each layer making up the multiple epitaxial layer.
Figure 9B:
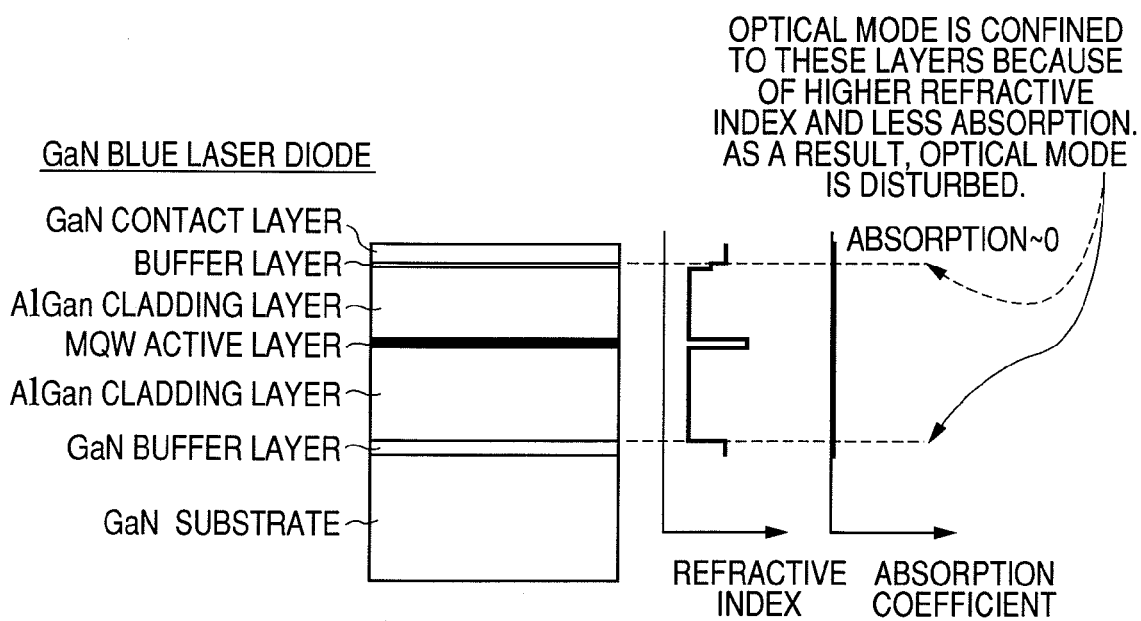
FIG. 9B is a drawing showing the composition of the multiple epitaxial layer (GaN) of the laser diode, and the refractive index and absorption coefficient for each layer making up the multiple epitaxial layer.

FIG. 9A is a drawing showing the structure of the multiple epitaxial layers in the AlGaInP red laser, as well as the refraction index and absorption coefficient in the semiconductor layers making up the multiple epitaxial growth layers. FIG. 9B is a drawing showing the structure of the multiple epitaxial layers in the GaN blue laser, as well as the refraction index and absorption coefficient in the semiconductor layers making up the multiple epitaxial growth layers.

Figure 10B:
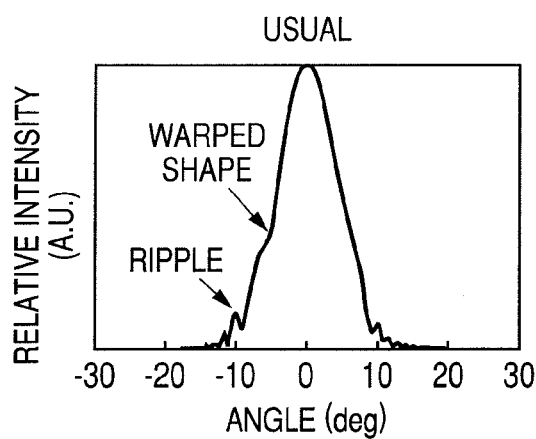
FIG. 10B is a graph showing the horizontal FFP shape of the laser diode.

The GaN blue laser as shown in FIG. 9B is multiple epitaxial growth layers formed in sequential laminations including a GaN buffer layer, an AlGaN cladding layer, a MQW active layer, an AlGaN cladding layer, a super lattice buffer layer, and a GaN contact layer on the GaN substrate. The MQW active layer possesses the highest refractive index among the semiconductor layers, followed by the GaN layer (GaN substrate, GaN buffer layer and GaN contact layer), and the remaining AlGaN layers have a low index. The light absorption coefficient is near zero in every layer. The absorption coefficient will also be near zero "0" in each case. In semiconductor lasers with no light absorption and a high refractive index, light attracts easily into the layers and disturbs the guided mode. In other words, as shown in FIG. 10B, the shape distortion and ripple tend to easily occur in the horizontal shape of the FFP.

The AlGaInP red laser shown in FIG. 9A is multiple epitaxial growth layers formed in sequential laminations including a GaAs buffer layer, an AlGaInP cladding layer, a MQW active layer, an AlGaInP cladding layer, a GaInP buffer layer, and a GaAs contact layer on the GaAs substrate. The GaAs layers (GaAs substrate, GaAs buffer layer and GaAs contact layer) possess the highest refractive index among the semiconductor layers, the MQW active layer and the GaInP buffer layer are next highest, and the AlGaInP layer has a low index. The light absorption coefficient is large in GaAs layers and GaInP layers but is zero in the remaining semiconductor layers. In this type of laser diode the GaAs layers and the GaInP layers serve as the absorption layers no light enters even if the refraction index is high. Therefore, applying the present invention in this way to laser diodes whose semiconductor substrate structure includes bandpass energy functioning as a light absorption layer that absorbs light from lasing wavelength of the active layer renders an FFP with no ripple or distortion.

Unlike the laser diode in FIG. 9A, the laser diode 1 of the first embodiment contains no GaAs buffer layer and no GaInP buffer layer. However, the relation between the refractive index and the absorption coefficient is the same for both laser diodes. The effect achieved by this invention remains the same even if a GaAs buffer layer and GaInP buffer layer are formed in the laser diode of the first embodiment. Even if other semiconductor layers are formed within the laser diode 1 of the first embodiment, the effect of this invention can be obtained provided that there is no change in the relation between the refractive index and the absorption coefficient.

Figure 8:
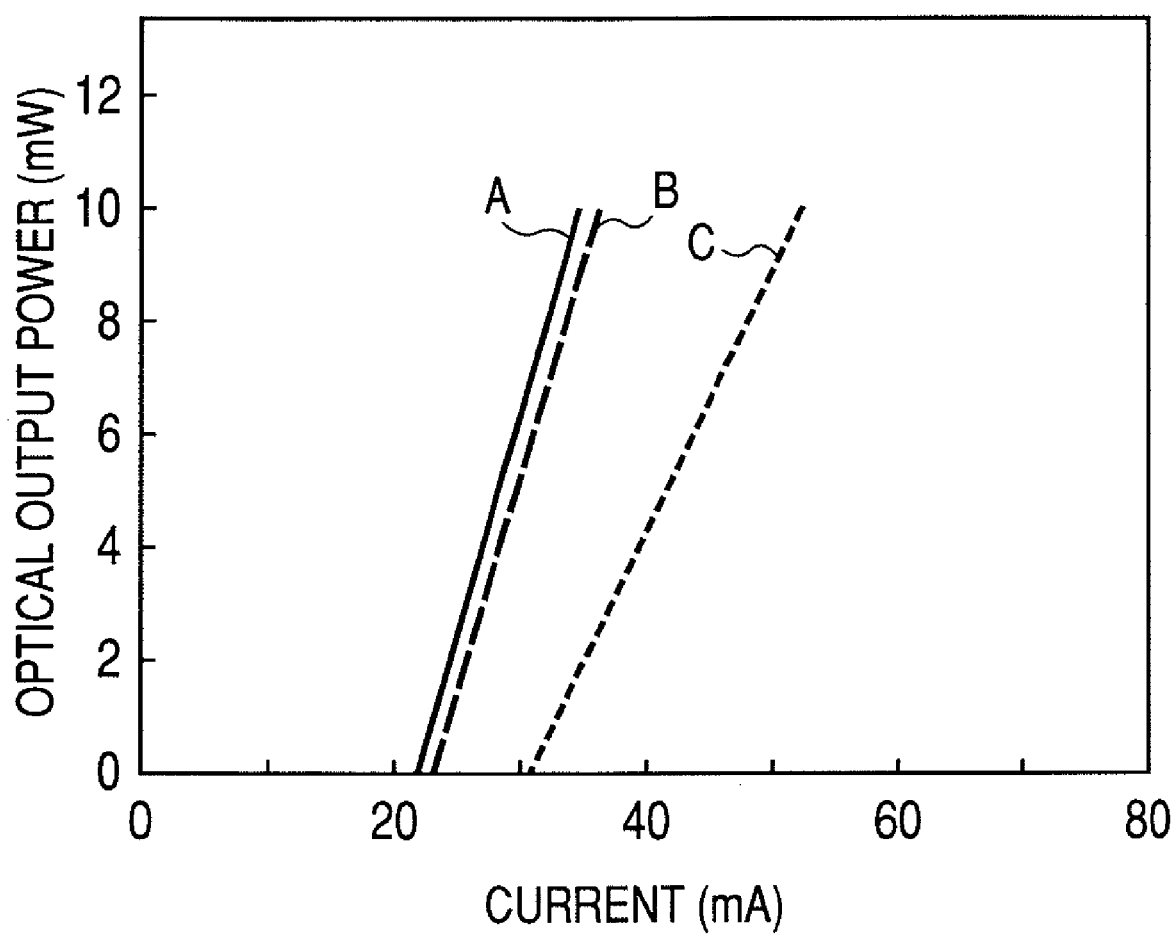
FIG. 8 is a graph showing the correlation between the electrical current and the light output in the laser diode.

(2) The laser diode 1 of the first embodiment has satisfactory light emission efficiency and operates on reduced driving current. FIG. 8 is a graph showing the light output versus current characteristics of the ridge type laser diode of the first embodiment, and the buried heterostructure laser diode of the fourth embodiment described later, and the loss guided structure laser diode of the related art. In FIG. 8, the line A shows characteristics of the ridge type laser diode of the first embodiment, line B shows characteristics of the buried heterostructure laser diode of the fourth embodiment containing a groove 22 the same as in the first embodiment, and the line C shows the characteristics of the loss guided structure laser diode of the related art.

In laser diodes containing a current blocking layer, the device (laser diode) characteristics vary greatly according to the crystal particles (semiconductor layer) utilized in the current blocking layer. Laser diodes in leveler applications use GaAs in the current blocking layer, and typically employ a loss guided structure for regulating the guided mode within the laser via the absorption losses in the current blocking layer. The light internal loss αi within the laser always becomes large in these type of loss guided structures, so that as shown in C of FIG. 8 the tilt dL/dI (L: light output, I: current) in the light output versus current characteristics cannot be increased. Moreover, the width of the ridge for injecting current must be enlarged (generally, about 5 micrometers) to obtain the device characteristics, and the device designed to suppress light impurities in current blocking layer. Enlarging the size of the region for injecting current caused the problem of increased current flow.

In the case of the buried heterostructure laser diode with the device characteristics of B in FIG. 8, the structure has been changed from a current blocking layer made from GaAs to a structure using Al (Ga) InP. This Al (Ga) InP is a crystal (particles) having almost no light absorption so that current is effectively blocked and the light internal loss αi can be small. Consequently, compared to the loss guided laser diode, a low threshold current and high efficiency light output versus current characteristic can be obtained as shown in B FIG. 8.

The laser diode 1 of the first embodiment has a structure where the ridge contains p-cladding layer 5 and p-contact layer 6, as well as a material on both sides of ridge 7 with virtually no light absorption or namely a structure where a dielectric layer (insulating layer 8) covers both sides of ridge 7 for current blocking. This structure has even smaller light internal loss αi than the real index guided structure-buried heterostructure laser diodes whose characteristic is shown in A, and improves the light emission efficiency. This structure further possesses a ridge width of 2 micrometers for controlling the optical guided mode within the laser so that the light output versus current characteristic as shown in A of FIG. 8 is satisfactory compared to the light output versus current characteristic C of the loss guided laser diode. The laser diode 1 structure of the first embodiment achieves a low threshold current, and therefore a reduce driving current can be obtained, and also raises the tilt dL/dI of the light output versus current characteristic to improve the light emission characteristic.

Figure 11A:
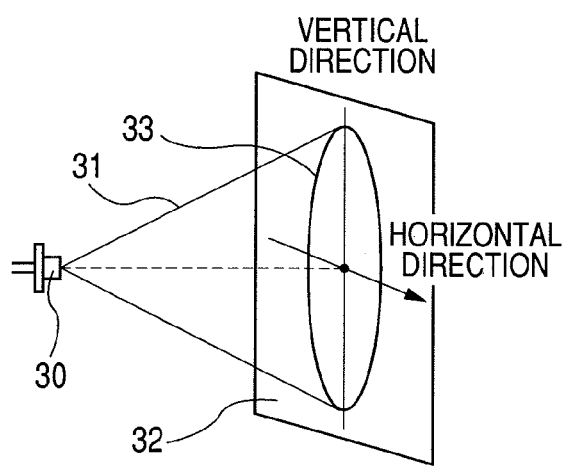
FIG. 11A is a drawing showing the horizontal projected image of the laser diode without distortion.
Figure 11B:
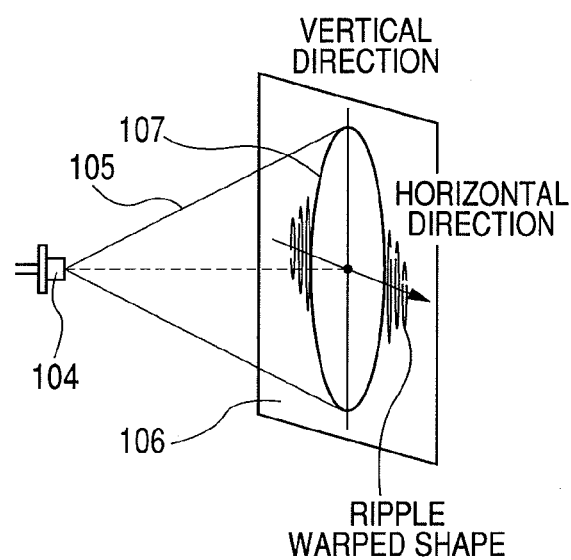
FIG. 11B is a drawing showing the horizontal projected image of the laser diode with distortion.

(3) Problems causing distortion in the image projected by the laser beam can be prevented in major applications for laser diodes in the visible light range, such as light sources for display devices including levelers and markers by using the laser diode 1 structure of the first embodiment. FIG. 11A is a concept drawing showing the FFP33 appearing as an ovoid shape when a semiconductor laser apparatus 30 including the laser diode 1 of the first embodiment is projecting a laser beam 31 onto the screen 32. When using the laser diode 1 of the first embodiment that generates no ripple or shape distortion in the FFP, there will be no distortion such as shown in FIG. 11B in the FFP33 of the ovoid shapes appearing on the screen 32.

Also, when using this laser diode 1 of the first embodiment as light sources in display devices such as levelers or markers, the laser beam 31 that is emitted, is utilized by the lens as a (parallel) light ray. However there is no electroluminescent light intruding into the laser beam since the groove 22 blocks any electroluminescent light. Consequently there is no distortion in the projected image appearing on the display object such as the screen.

Figure 12A:
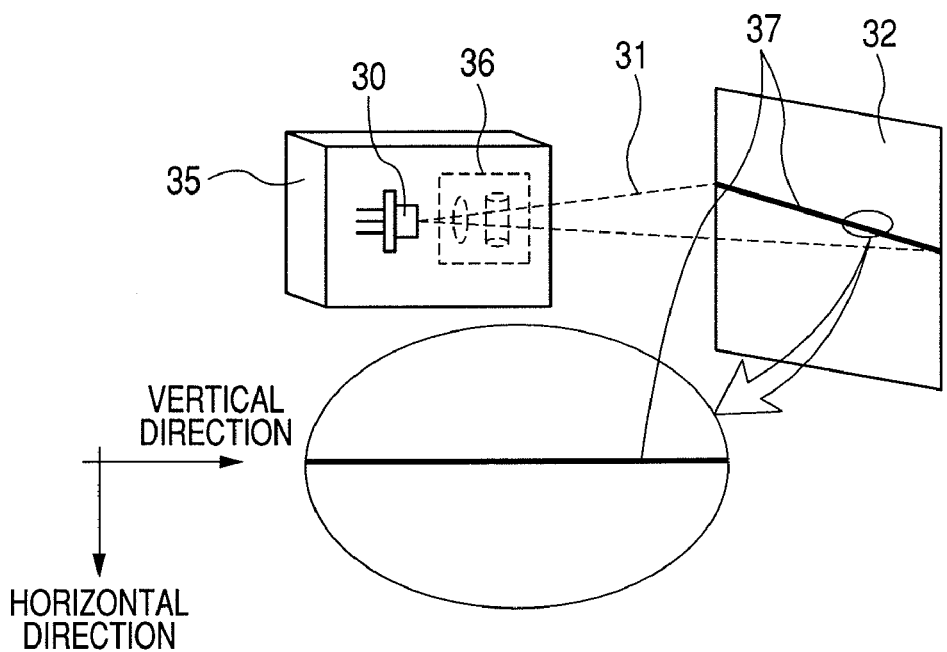
FIG. 12A is a concept drawing showing distortion in the leveler output line when using the laser diode in a leveler.
Figure 12B:
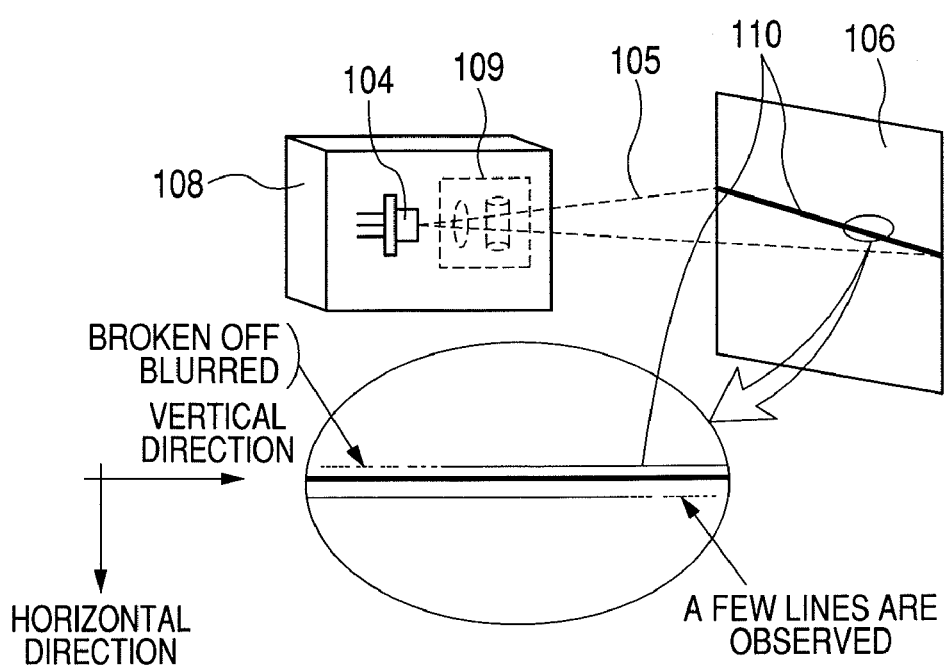
FIG. 12B is a concept drawing showing distortion in the leveler output line when using the laser diode in a leveler.

FIG. 12A is a drawing showing the projected image when using a semiconductor laser apparatus 30 including the laser diode 1 of the first embodiment in a leveler 35. One ray (line) 37 extending vertically by adjusting the lens 36 for the laser beam 31 emitted from the semiconductor laser apparatus 30 appears on the screen 32. The ovoid in the lower part of the figure shows an enlarged view of the beam (line) 37 as the line output from the leveler. Note that the line 37 within the ovoid is actually extending in a vertical direction although the line is horizontal in the figure.

In the case of the semiconductor laser apparatus 30 including the laser diode 1 of the first embodiment where no ripple or distortion occurs, there are no multiple lines or cut off or blurred lines in the line 37 appearing in screen 32 even when the image is enlarged. Visually examining the projected image confirmed that the ray (line) 37 was a sharp straight line with a fixed width, and that the ray (line) 37 served as an effective reference line to allow clearly identifying the position.

Therefore display devices using the laser diode 1 of the first embodiment as a light source function as display devices with both excellent beam quality and long term drive operation.

(4) In the present embodiment, a groove 22 is formed simultaneously with the isolating groove 23 of the related art. Therefore, no additional production steps are required for fabricating the laser diode of this embodiment that uses the groove 22, and high manufacturing costs resulting from increasing the number of production processes can be avoided.

(5) Next, the differences between the laser diode of the first embodiment and the patent documents 2 and 3 are described. The technology disclosed in the patent documents 2 and 3 mainly utilizes a GaN type nitrogen laser diodes.

In GaN type semiconductor lasers, the semiconductor substrate uses GaN (gallium nitride) which has a higher refractive index than the cladding layer. The laser light penetrating into this highly refractive substrate interferes with the main beam and is known to cause characteristic problems such as ripple in the FFP and an easily distorted shape. These structures of the related art were contrived to deal with the inherent problems of GaN but do not provide an effective means for coping with the previously described problem of distortion in the projected image.

The method disclosed in patent document 2 forms a groove in the emission end of the laser or forms multiple cavities in the vicinity of that end. However no description of how to form the surface of the groove formed in the end. Even if a groove or cavities are formed according to this disclosed structure, the electroluminescent light that propagated along the active layer will be emitted outside the laser diode so that the main projection image will eventually become distorted and unwanted images will appear. This technology of the related art differs greatly from the present invention in that it does not consider how to completely eliminate electroluminescent light emissions into account as can be seen in the structure for forming multiple cavities and the fact that the structure is intended mainly to correct scattered (distorted) light laser light emitted from the ridge structure from interfering with the main laser beam light emission.

The method disclosed in patent document 3, employs a structure where a side surface with an active layer cross is formed different from the surface forming the resonant cavity mirror for the laser, and a blocking layer is formed on that (side) surface. However, this blocking layer is only in the vicinity of the ridge structure and the blocking layer allows a certain amount of light transmittance in the layer, so that the structure does not completely prevent light leakage from inside the laser. Moreover, in the embodiment of patent document 3, the structure contains a blocking layer directly to the side of the waveguide structure which causes sharp fluctuations in the waveguide structure refraction index. Consequently, the laser light propagating along the optical waveguide becomes scattered after undergoing a change in refraction rate at the boundary where the blocking layer is formed, and causes light scattering. The scattered light that was generated interferes with the light on the waveguide to cause a drop in the quality of the emitted laser beam. Due to these reasons, the previously described problems caused by electroluminescent light cannot be solved even by employing the methods disclosed in patent document 2 or patent document 3. However utilizing the structure described in the present invention will prove effective for resolving this problem.

Second Embodiment

Figure 13:
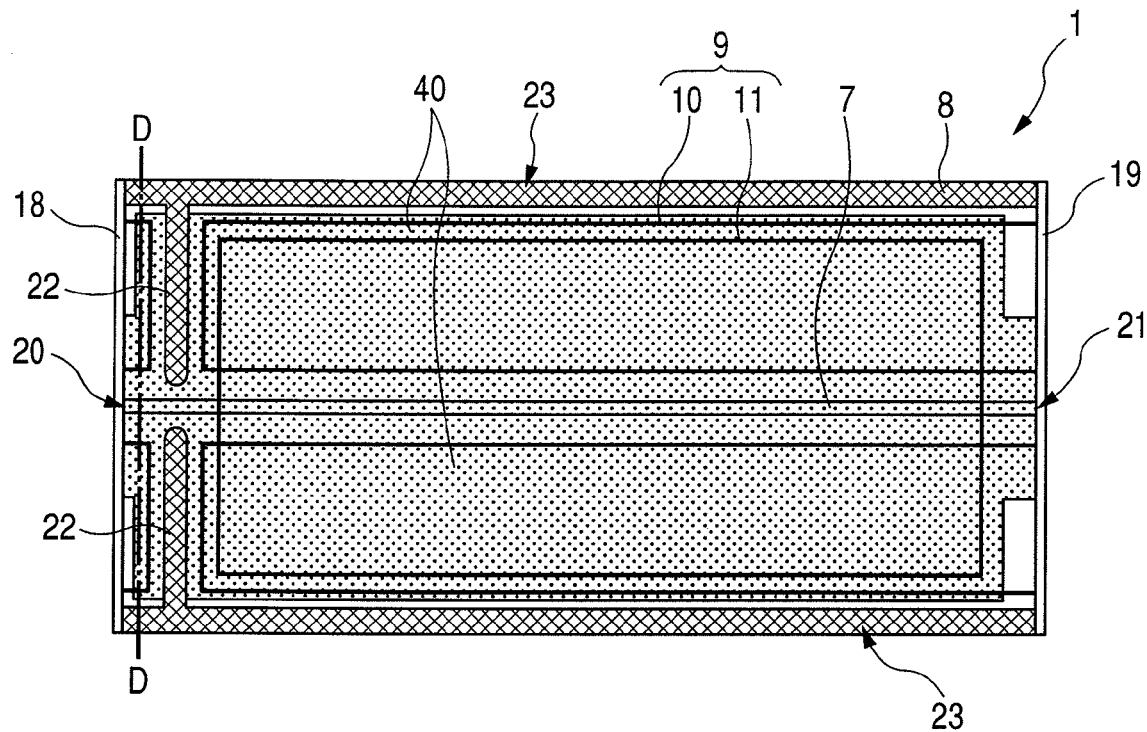
FIG. 13 is a flat (plan) view of the laser diode of the second embodiment of this invention.
Figure 14:
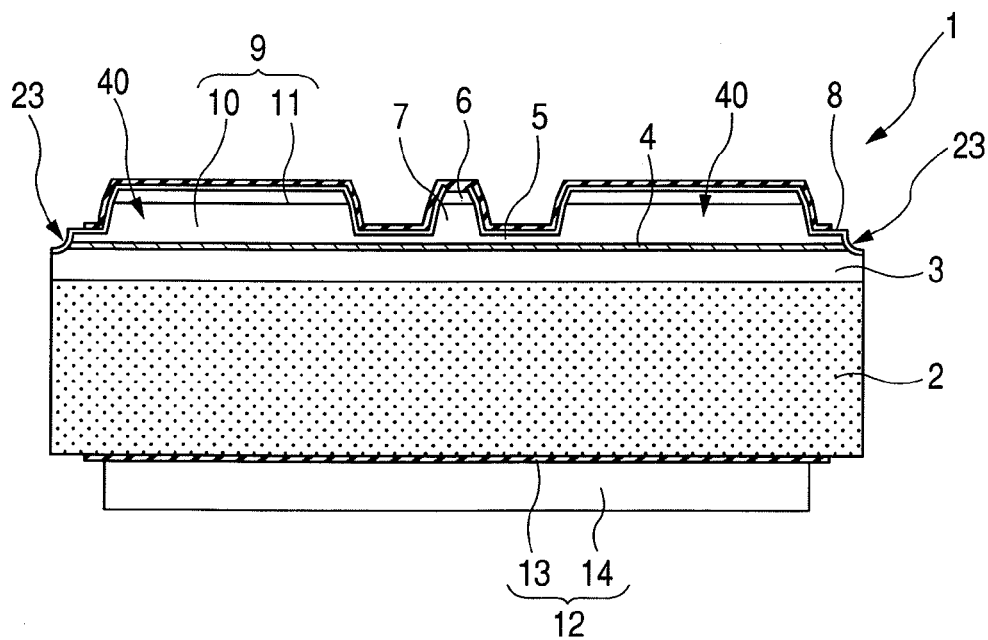
FIG. 14 is a cross sectional view taken along lines D-D of FIG. 13.

FIG. 13 is a flat (plan) view of the laser diode of the second embodiment of this invention. FIG. 14 is a cross sectional view taken along lines D-D of FIG. 13.

The second embodiment is a structure of containing a dummy ridge 40 for protecting ridge sections on both sides of ridge 7 in the laser diode 1 of the first embodiment. The laser diode 1 of the first embodiment contains one stripe-shaped ridge 7 protruding in the center on the first surface side of the n-GaAs substrate 2, in a state where only the ridge section protruded on the chip end surface. Therefore when the end sections came in contact with the conveyor jig and other materials in the wafer cleaving process, the (singulation) process for shearing the chips into short strips (bars) and the chip fabrication process, a strong force is applied just to the ridge section causing gap loss/damage to occur in the ridge section. To prevent this damage a protective dummy ridge structure was formed.

The fabrication process for the laser diode 1 of the second embodiment is identical to the first embodiment, however in the ridge 7 forming process, a dummy ridge can be formed by etching the p-contact layer 6 and the p-cladding layer 5 to change the pattern.

Damage to the end sections of the ridge 7 during handling laser diode 1 of the second embodiment can in this way be prevented.

Third Embodiment

Figure 15:
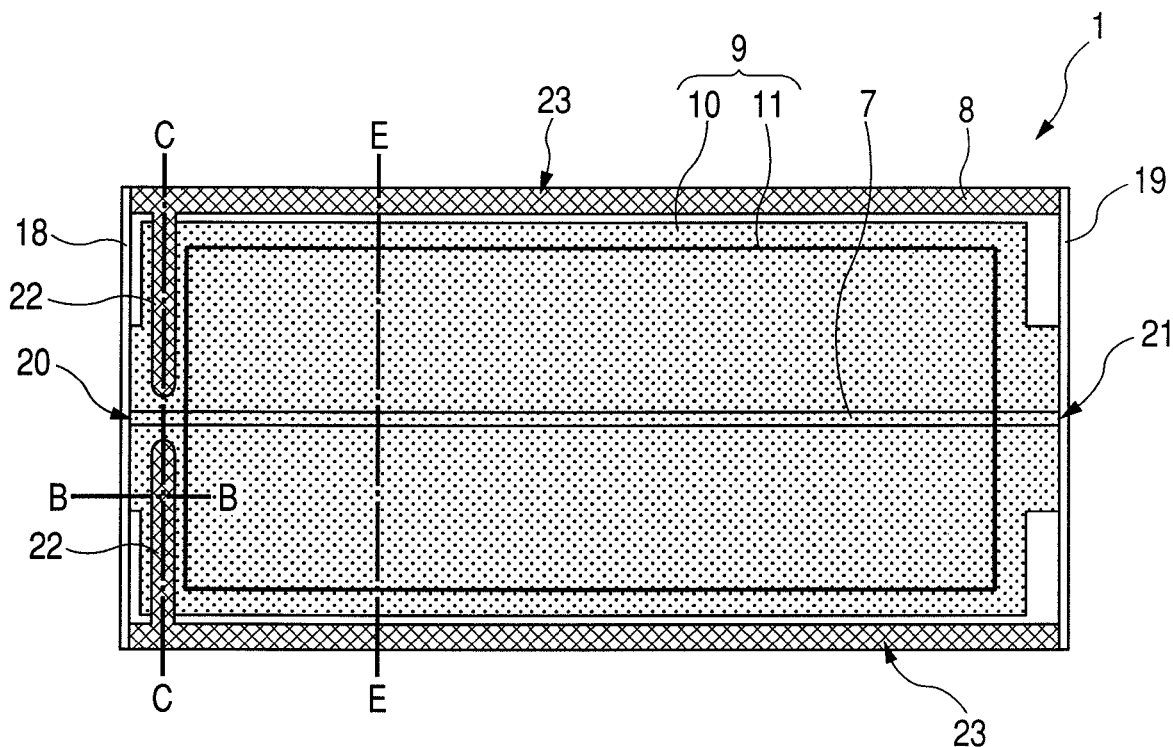
FIG. 15 is a flat view showing the laser diode of the third embodiment of this invention.
Figure 16:
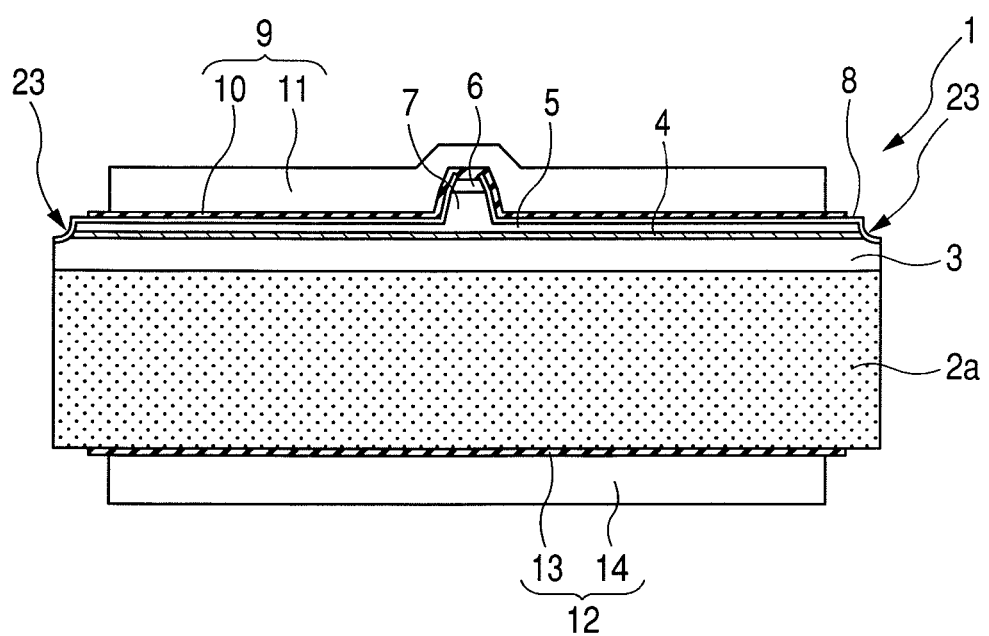
FIG. 16 is a cross sectional view taken along lines E-E of FIG. 15.
Figure 17:
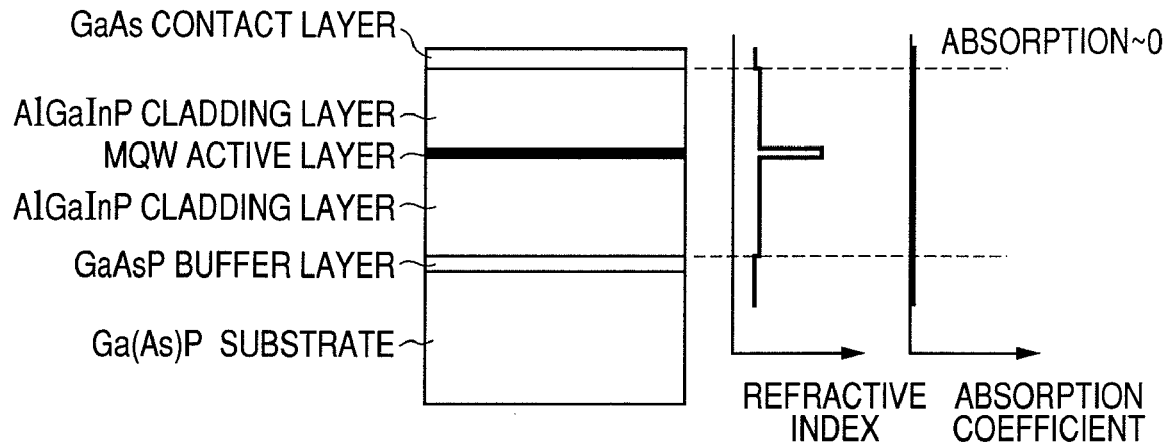
FIG. 17 is a drawing showing the composition of the multiple epitaxial layer of the laser diode of the third embodiment, and the refractive index and absorption coefficient for each layer making up the multiple epitaxial layer.

FIG. 15 through FIG. 17 are drawings of the laser diode for the third embodiment of this invention. FIG. 15 is a flat (plan) view of the laser diode. FIG. 16 is a cross sectional view taken along lines E-E of FIG. 15. FIG. 17 is drawings showing the structure of the multiple epitaxial layers in the laser diode, and showing the absorption coefficients and refractive indices of each semiconductor layer.

The laser diode 1 of the third embodiment shown in FIG. 15 and FIG. 16 is identical to structure for the laser diode 1 of the first embodiment. FIG. 17 shows the laminated structure of the semiconductor layers for the laser diode 1 of the third embodiment, and also a buffer layer added between the n-cladding layers and the semiconductor substrate. The laser diode with the laminated structure of semiconductor layers in FIG. 17 is effectively no different in terms of effect than the laser diode 1 shown in FIG. 15 and FIG. 16. FIG. 17 corresponds to the drawing in FIG. 9A, and shows the laminated structure of the semiconductor layers, as well as the absorption coefficients and refractive indices of each semiconductor layer. Therefore in the description for the third embodiment, an "a" is added to the reference numerals of the first embodiment where the material has been changed.

In the laser diode 1 of the third embodiment, the refractive index for all semiconductor layers between the semiconductor substrate and the active layer is a higher value than the semiconductor substrate. (See FIG. 17.) Each layer is configured as follows to ensure that the value refractive index for all semiconductor layers between the semiconductor substrate and the active layer is a higher value than the semiconductor substrate refractive index value. The semiconductor substrate is a Ga (As) P substrate 2a, the n-cladding layer 3 is made from AlGaInP, the active layer 4 is a single layer structure made from (Al) GaInP or is a multiple quantum well structure where a quantum well is made from GaInP and the quantum barrier made from GaInP, the p-cladding layer 5 is made from AlGaInP, and the p-contact layer 6 is made from GaAs. The laser diode 1 of the third embodiment is made to emit a laser beam on a lasing wavelength of 560 (yellow) to 640 nanometers (orange) by changing the material and composition of the material in the semiconductor layers.

The laser diode 1 of the third embodiment is fabricated by preparing a Ga (As) P substrate 2a as the semiconductor substrate, and then forming multiple epitaxial layers on this Ga (As) P substrate 2a, the same as in the method for the first embodiment. The multiple epitaxial layers are all sequentially formed the same as in the first embodiment, by forming an n-cladding layer 3 made from AlGaInP, an active layer 4 as a multiple quantum well structure where the quantum well is AlGaInP and the quantum barrier made is made from GaInP, and a p-cladding layer 5 made from AlGaInP, and a P-contact layer 6 made from GaAs.

The laser diode 1 of the third embodiment is a structure where the refractive index for all semiconductor layers between the semiconductor substrate (Ga (As) P substrate 2a) and the active layer is a higher value than the semiconductor substrate. Therefore, due to this effect and effect rendered by the groove, the electroluminescent light propagating through semiconductor layers and active layers with a high refractive index will not be emitted outside the front facet (forward emission end), and a satisfactory FFP can be obtained.

Figure 18:
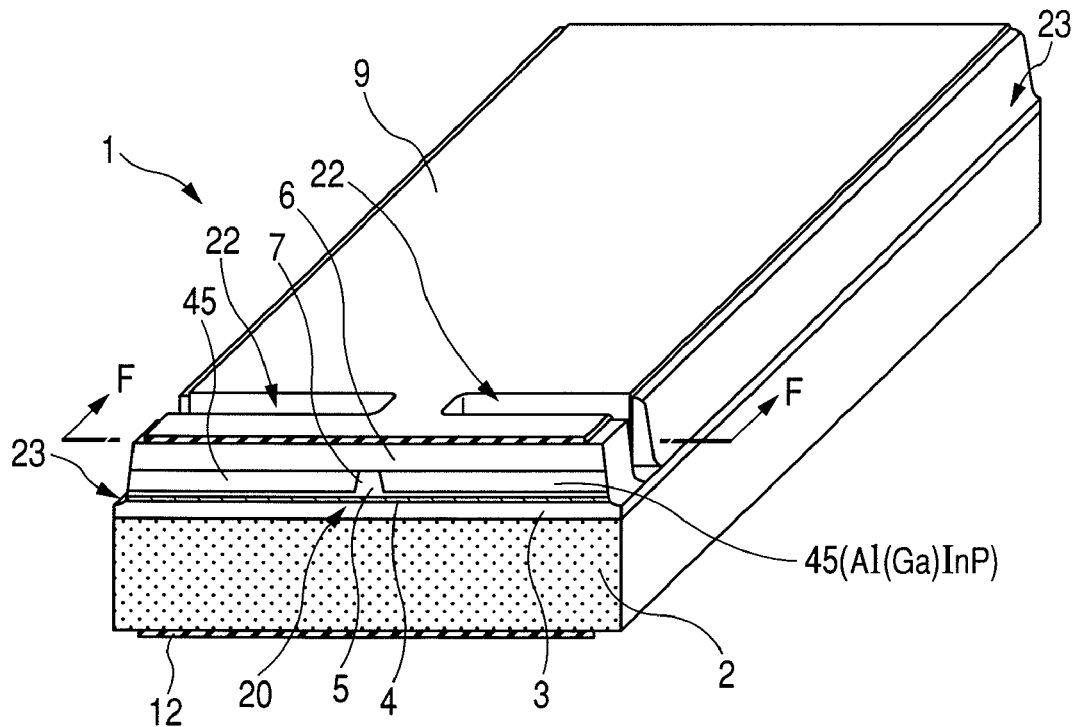
FIG. 18 is a perspective view of the laser diode of the fourth embodiment of this invention.
Figure 19:
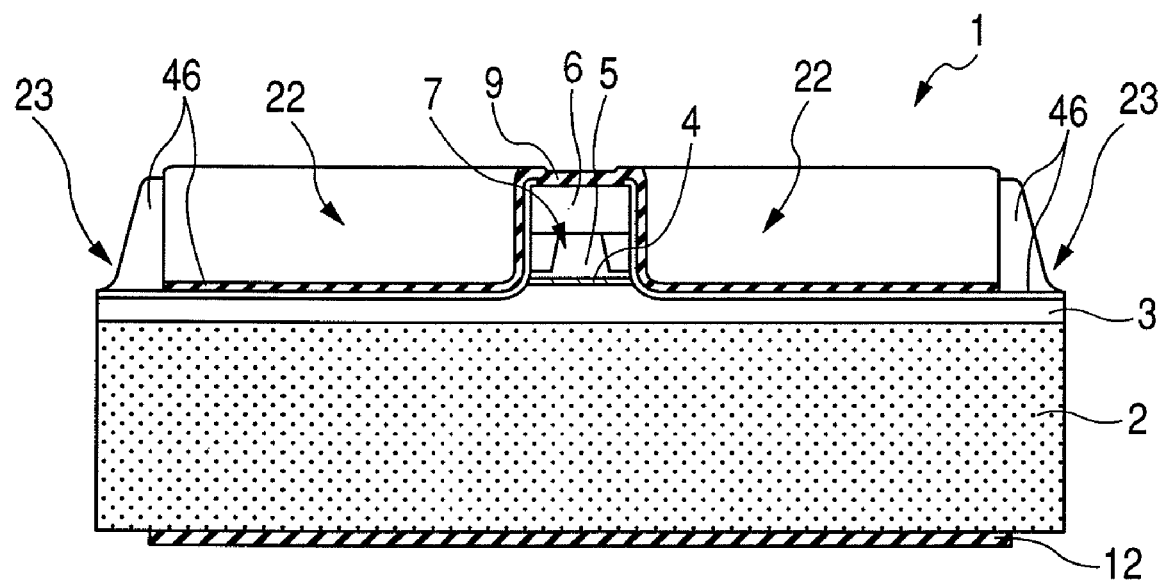
FIG. 19 is a cross sectional view taken along lines F-F of FIG. 18.
Figure 20A:
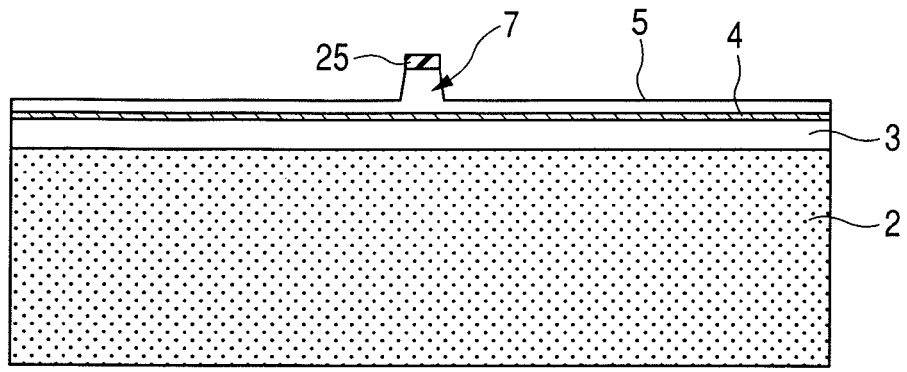
FIG. 20A is a cross sectional drawing for fabrication of the laser diode of the fourth embodiment showing processes from forming the epitaxial layers to forming the groove.
Figure 20B:
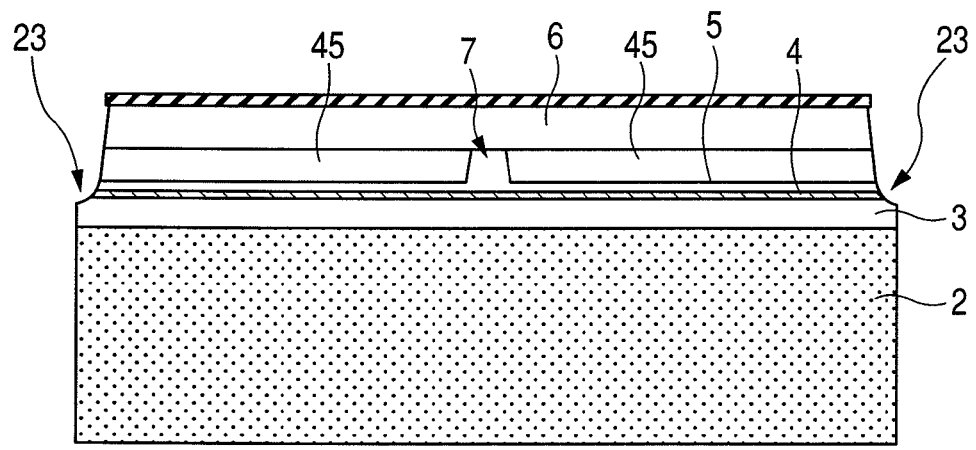
FIG. 20B is a cross sectional drawing for fabrication of the laser diode of the fourth embodiment showing the process for forming the n-current blocking layer.
Figure 20C:
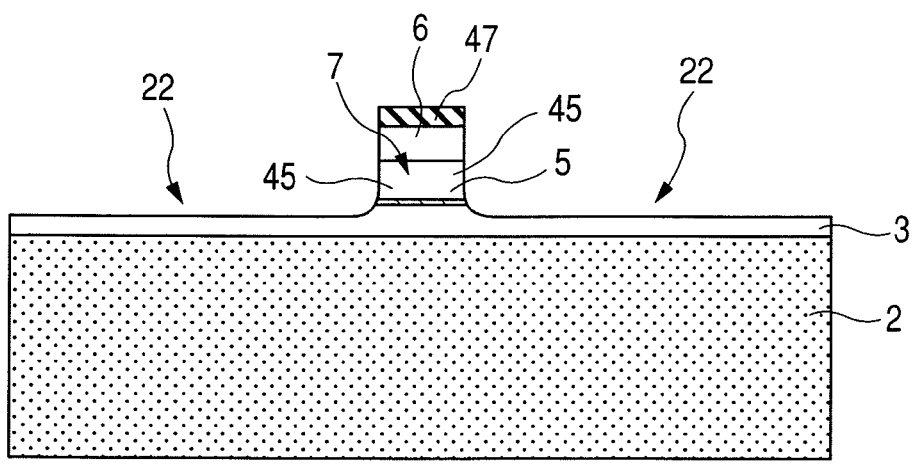
FIG. 20C is a cross sectional drawing for fabrication of the laser diode of the fourth embodiment showing processes from forming the epitaxial layers to forming the groove.
Figure 21A:
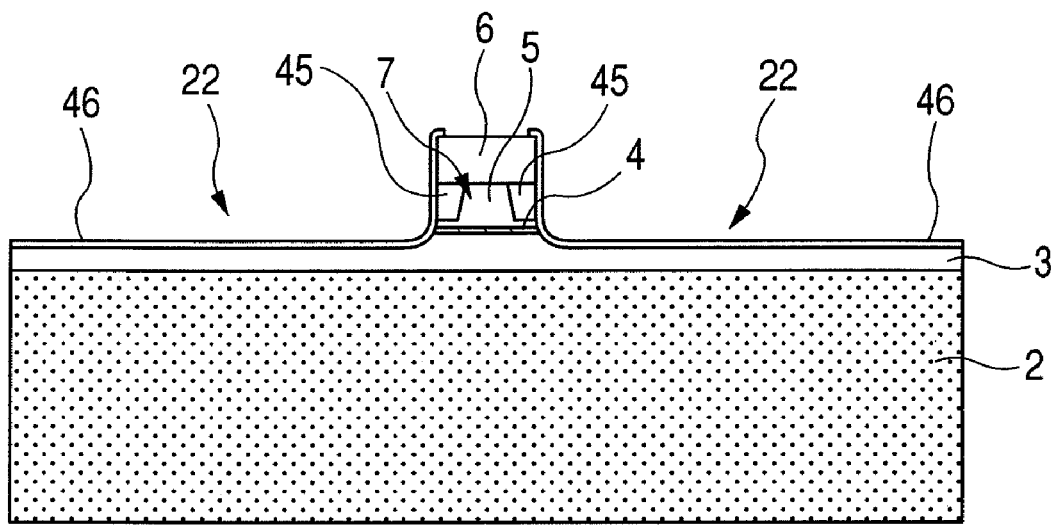
FIG. 21A is a cross sectional drawing showing processes from forming the insulating layers to forming the p-electrode in the fabrication of the laser diode of the fourth embodiment.
Figure 21B:
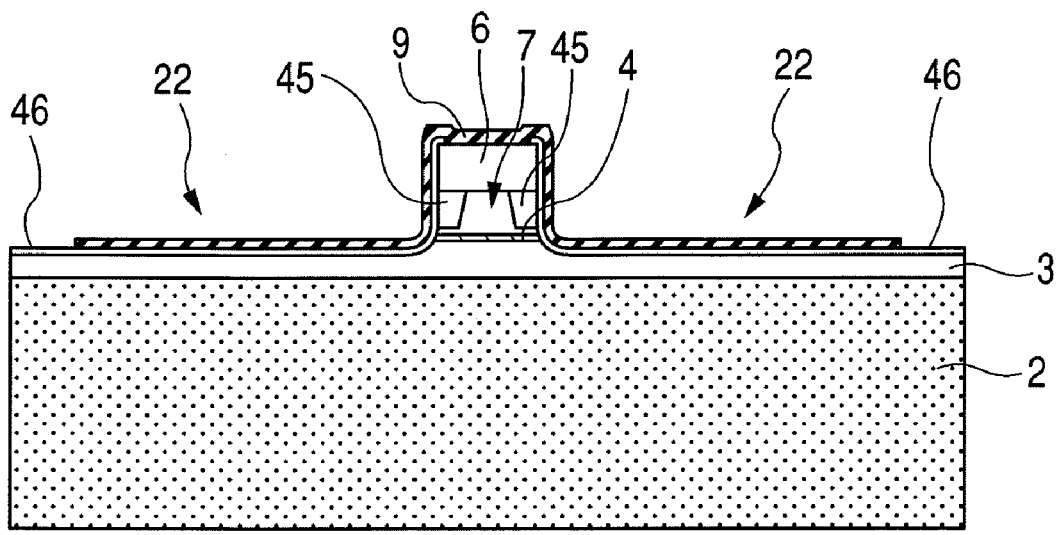
FIG. 21B is a cross sectional drawing showing processes from forming the insulating layers to forming the p-electrode in the fabrication of the laser diode of the fourth embodiment.
Figure 22:
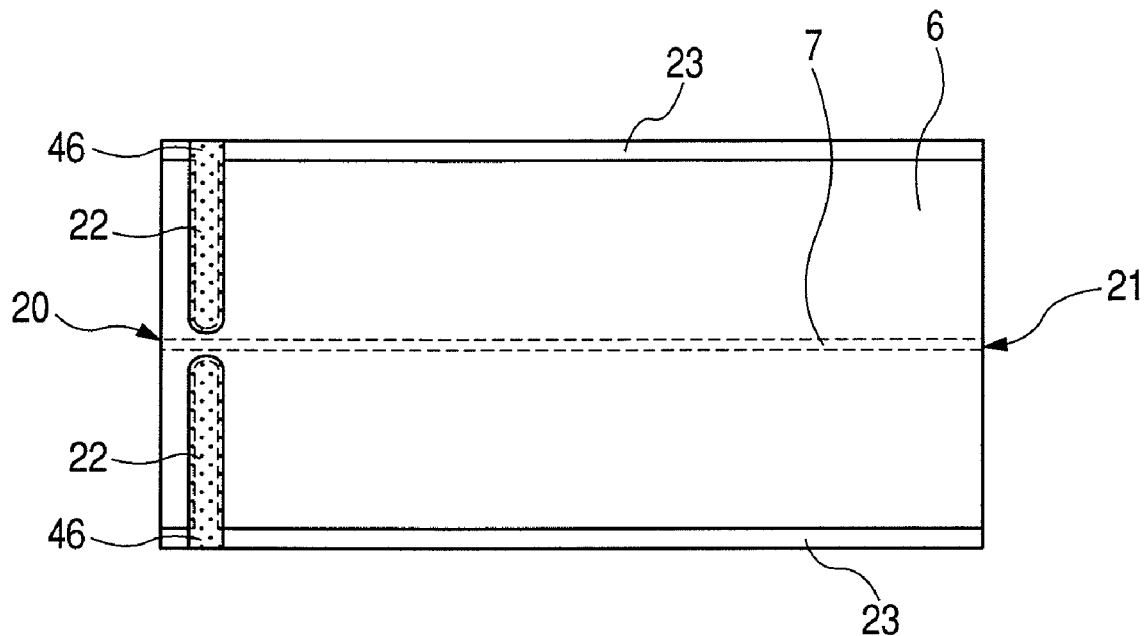
FIG. 22 is a flat (plan) view showing the forming region for the insulating layer of the laser diode.
Figure 23:
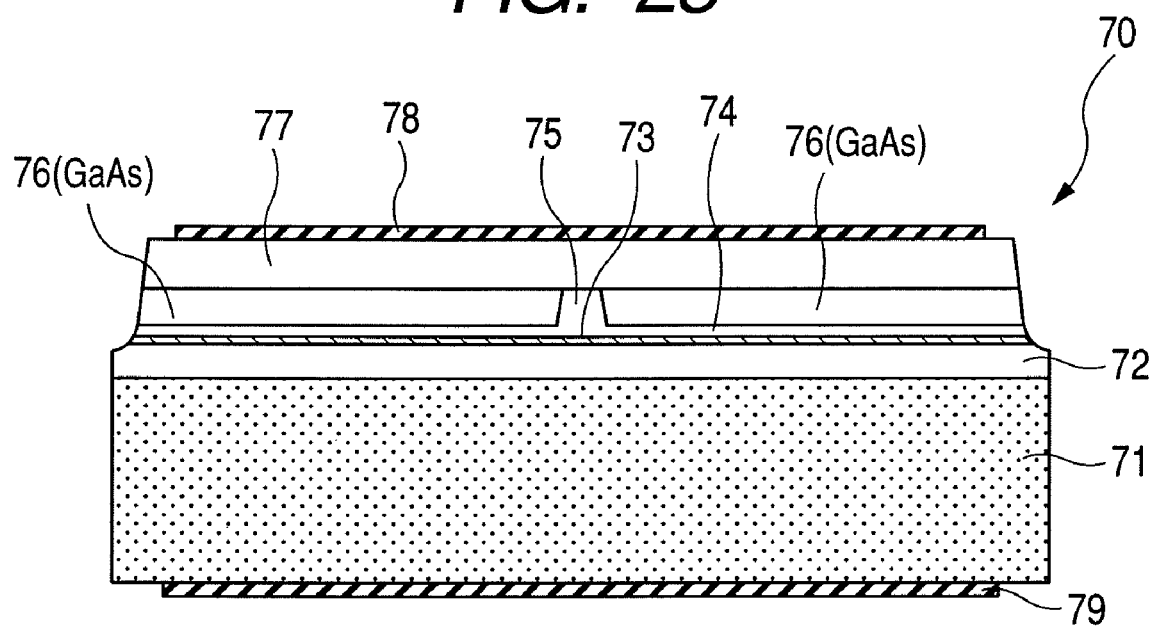
FIG. 23 is a cross sectional view of the loss guided type buried heterostructure laser diode of the related art.

FIG. 18 through FIG. 22 are drawings relating to the laser diode of the fourth embodiment. FIG. 18 is a perspective view of the laser diode. FIG. 19 is a cross sectional view taken along lines F-F of FIG. 18. FIG. 20 through FIG. 22 are drawings relating to the fabrication of the laser diode.

Figure 24:
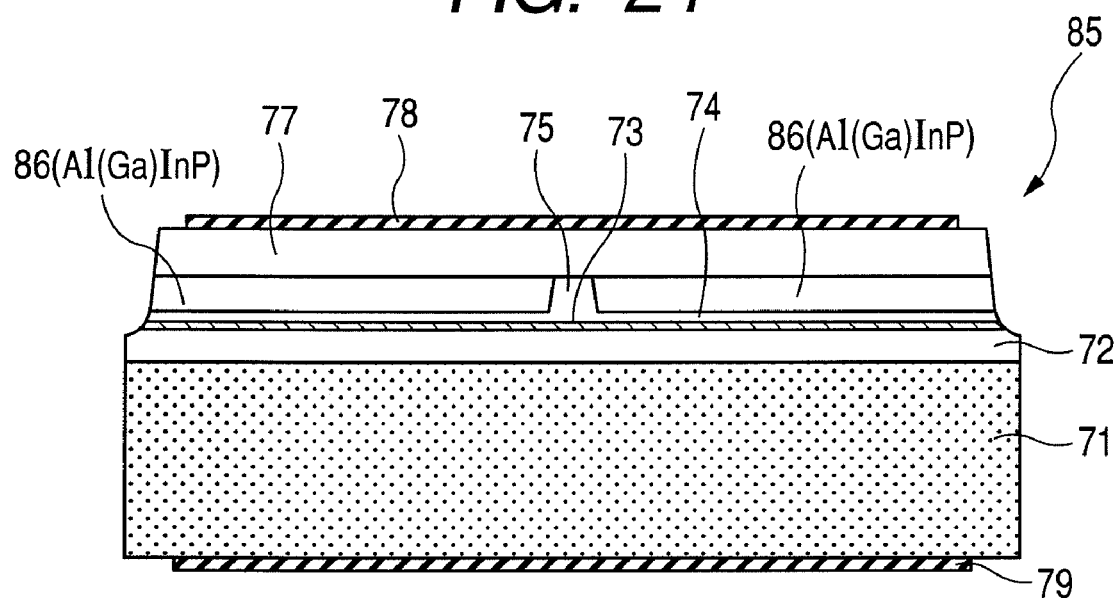
FIG. 24 is a cross sectional view of the real index guided type buried heterostructure laser diode of the related art.
Figure 25:
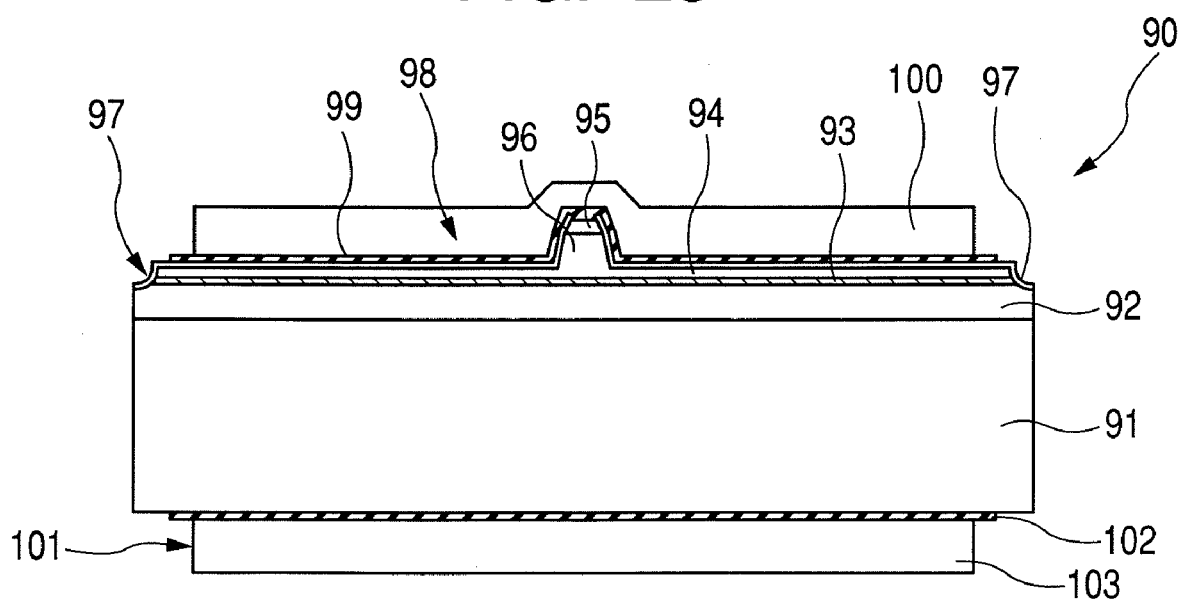
FIG. 25 is a cross sectional view of the real index guided type ridge type laser diode of the related art.

The laser diode 1 of the fourth embodiment is a real index guided buried heterostructure laser diode of the related art shown in FIG. 24, formed with a groove 22 to apply this invention.

In the laser diode 1 of the fourth embodiment, a multiple epitaxial layer is formed on the upper surface of the n-GaAs substrate 2 as shown in FIG. 18. These multiple epitaxial layers are a sequentially laminated structure of n-cladding layer 3 made from AlGaInP, an active layer 4 as a multiple quantum well structure where the quantum well is made from GaInP and the quantum barrier made from AlGaInP, and a p-cladding layer 5 made from AlGaInP. The active layer may be a single structure made from (Al) GaInP. The p-cladding layer 5 is then selectively etched (removed by etching) from the upper surface of p-cladding layer 5 to a specified depth along the p-cladding layer. This etching forms one ridge 7 extending in a stripe shape along the center upper surface of the n-GaAs substrate 2.

A n-current blocking layer 45 pair made from Al (Ga) InP is formed on a section of the p-cladding layer 5 remaining on both sides of the ridge 7. The pair of n-current blocking layers 45 is a structure enclosing the ridge 7. The pair of n-current blocking layers 45 contains bandgap energy that is transparent to light on the light emission wavelength of the active layer 4. A p-contact layer 6 made from GaAs is formed on the ridge 7 and the n-current blocking layer 45.

Both sides of the laser diode 1 are subjected to mesa etching, to form a mesa (table section) on the section from the p-contact layer 6 to the n-cladding layer 3. The isolating groove 23 is cleaved along the center to form the mesa section.

A p-electrode 9 is formed on the upper surface of the p-contact layer 6, and an n-electrode 12 is formed on the lower surface of the n-GaAs substrate 2. Though not shown in the drawing, reflection coatings are formed respectively on the side surfaces (facets) of the laser diode 1 that form both sides of the ridge 7. An AR coating film is formed on the front facet (forward emission side) which is one end among both ends of the laser diode 1. Also a HR (high-reflective) coating film whose reflectivity is higher than the front facet of the AR coating film, is formed on the rear facet (rear emission side) of the other end (of laser diode 1).

On the other hand, a characteristic of this invention is a pair of grooves 22 formed in the same way as the first embodiment. Namely, as shown in FIG. 18 and FIG. 19, the grooves 22 are formed from the p-contact layer 6 along the front facet 20 and separated from the side edge of the ridge 7 at a specified distance to the side edge of the active layer 4, on one end on both sides of ridge 7 (front facet 20). These grooves 22 are also formed from the p-contact layer 6 to a depth exceeding the active layer 4. These grooves 22 are covered by an insulating layer 46 as shown in FIG. 19. A p-electrode 9 is then formed on this insulating layer 46. The grooves 22 may reach to the n-GaAs substrate 2.

The laser diode 1 of the fourth embodiment is fabricated as shown in FIG. 20 and FIG. 21. FIG. 20 is process cross sectional drawings for fabrication of the laser diode showing the processes from forming the multiple epitaxial layers to forming the groove. FIG. 21 is process cross sectional drawings for fabrication of the laser diode from forming the insulating layer to forming the p-electrode. FIG. 22 is a flat (plan) view of the laser diode showing the forming region for the insulating layer of FIG. 21.

First of all, after preparing the n-GaAs substrate 2, a multiple epitaxial layer is formed over the n-GaAs substrate 2 by sequentially forming an n-cladding layer 3 made from AlGaInP, an active layer 4 as a multiple quantum well structure where the quantum well is made from GaInP and a quantum barrier is made from AlGaInP, and a p-cladding layer 5 is made from AlGaInP.

Next as shown in FIG. 20A, an etching mask 25 with a width of 2 micrometers is formed the same as in the first embodiment in the Y direction along the center of each product forming section. A stripe-shaped ridge 7 is next formed below the etching mask 25 by etching partway into the n-cladding layer 3.

The etching mask 25 is then removed and an $SiO_2$ film not shown in the drawing is formed on the ridge 7. An n-current blocking layer 45 of Al (Ga) InP is formed (See FIG. 20B.) on the thin n-cladding layer 3 on both side of the ridge 7 by selective growth by the MOCVD method using this $SiO_2$ mask. This upper surface of this n-current blocking layer 45 is formed the same as the upper surface of the ridge 7, and the $SiO_2$ film is then removed.

The p-contact layer 6 is then formed over the entire side of the n-GaAs substrate 2 (See FIG. 20B.).

As shown in FIG. 20B, an isolating groove 23 is formed at a position on the sides along the Y direction of the product forming section.

The grooves 22 are formed on both sides of the ridge 7 the same as in the first embodiment. An etching mask 47 is therefore selectively formed on the p-contact layer 6, and a groove 22 then formed by etching the same as in the first embodiment (See FIG. 18.). The dimensions and the forming position of the groove 22 are the same as in the first embodiment.

Next, as shown in FIG. 21A, an insulating layer 46 is made to cover the groove 22 in a state where the surface (upper side) of the p-contact layer 6 enclosed by the pair of grooves 22 is exposed. FIG. 22 is a flat (plan) view showing the product forming section and the section indicated by the dotted lines is the grooves 22.

Next, a p-type electrode 9 is formed on the front surface side of the n-GaAs substrate 2 as shown in FIG. 21B and FIG. 18. The pattern for the p-electrode 9 forms a pattern as shown in FIG. 18. As shown in FIG. 22, an insulating layer 46 in a short length along the ridge 7 in order to prevent the layers such as the active layer exposed on the surface of the grooves 22, and the n-cladding layer 3 from electrically contact with the p-electrode 9. The insulating layer 46 shown in FIG. 18 is omitted.

Though the following processes are not shown in the drawing, the second surface of the n-GaAs substrate 2 is removed to a specified thickness to achieve an overall thickness of approximately 100 micrometers.

Next, an n-electrode 12 on the second surface of the n-GaAs substrate 2.

The n-GaAs substrate 2 is next cleaved at fixed intervals (600 micrometers) in a direction intersecting the direction that the ridge 7 extends, in order to form short strips (bars).

Next, along with forming an AR coating film on the front facet (forward emission side) of the short strips (bars), and HR coating film is formed on the rear facet.

The short strips (bars) are next cut along the boundaries of the product forming section to form multiple laser diodes 1 as shown in FIG. 18.

In the fourth embodiment, a laser diode 1 can be provided that is capable of preventing the front facet 20 from emitting electroluminescent light since even the buried heterostructure laser diode contains grooves 22 formed on the front facet 20 side, the same as in the first embodiment. This laser diode is therefore ideal as a light source for display devices including levelers and markers.

This invention was described above in detail based on the embodiments of the invention. However, this invention is not limited by these examples, and needless to say other variations and adaptations are possible without departing from the scope and spirit of this invention. For example, in the laser diode 1 of the first embodiment, even if the active layer is a single layer structure made from InGaAsP or even if a multiple quantum well structure made from InGaAsP and quantum barrier made from AlGaInP where the quantum barrier is a quantum well made of InGaAsP, a laser diode with a satisfactory FFP in the 600 to 690 nanometer band can still be obtained.

In the method for fabricating the laser diode 1 of the first embodiment, this type of laser diode can be obtained during forming of the active layer 4 when forming the multiple epitaxial layers on the n-GaAs substrate 2, by producing the active layer 4 as a single layer structure made from InGaAsP or as a multiple quantum well structure where the quantum well is made from InGaASP and the quantum barrier is made from AlGaInP.

In the method for fabricating the laser diode 1 of the first embodiment, since this type of laser diode is a structure where only the material of the active layer is changed, and the front facet (forward emission side) contains a groove, a laser diode can be provided that prevents electroluminescent light emissions from the front facet the same as in the first embodiment. This laser diode is therefore ideal as a light source for display devices including levelers and markers.

Therefore since the laser diode of each embodiment of this invention as described above is a real index guided structure capable of reducing the operating current and containing no distortion in the FFP, this laser diode is ideal as a light source for display devices including levelers and markers.

Light sources for display device must have low electrical power consumption in order to allow long-term operation even when using batteries. Moreover, the image projected by the laser beam must be sharp without distortion or blurring. The laser diode of this invention satisfactory meets these requirements for long-term, lower power operation and a sharp image.

What is claimed is:
1. A semiconductor laser diode device comprising:
a semiconductor substrate comprised of a first conductivity type semiconductor, and including a first surface, and a second surface as a side opposite the first surface;
a multiple epitaxial layer including sequentially formed layers of at least a first conductive cladding layer, an active layer, a second conductive cladding layer and second conductive contact layer on the first surface of the semiconductor substrate;
a ridge structure formed by selectively etching from the upper surface of the second conductive contact layer to a specified depth on the second conductive cladding layer, and extending in a first direction in a stripe shape extending between one pair of facets opposite each other on the semiconductor substrate along first and second end edges, respectively, of the semiconductor substrate;

an insulating layer formed over the first surface side of the semiconductor substrate on a section from a side surface of the ridge to the periphery of the semiconductor substrate;

a second electrode formed over the insulating layer over the second conductive contact layer of the ridge, and a first electrode formed on the second surface of the semiconductor substrate, wherein the semiconductor substrate contains bandpass energy serving as an absorption layer for light on the emission wavelength of the active layer, or the refractive index value for all semiconductor layers between the active layer and the semiconductor substrate is larger than the semiconductor substrate refractive index value, wherein grooves are formed on both sides at one end of the ridge, said grooves extending along the first end edge of the substrate in a second direction which is substantially perpendicular to the first direction in which the ridge extends, and from the second cladding layer separated a specified distance from a side edge of the ridge to the side of the active layer, and at a depth from the second conductive cladding layer exceeding the active layer, and wherein the groove is covered by an insulating layer.

2. The semiconductor laser diode device according to claim 1, wherein a facet coating layer is formed on one facet of the ridge, and a facet coating layer with the same or higher reflectivity is formed on the other side of the ridge.

3. The semiconductor laser diode device according to claim 1, wherein the distance between the side of the groove and the one end of the ridge is 3 to 50 micrometers.

4. The semiconductor laser diode device according to claim 1, wherein the groove width is 1 to 50 micrometers.

5. The semiconductor laser diode device according to claim 1, wherein the distance from the ridge side to the side of the groove is 1 to 15 micrometers.

6. The semiconductor laser diode device according to claim 1, wherein the upper edge of the insulating layer is at a position deeper than the lower edge of the active layer in the deepest section of the groove.

7. The semiconductor laser diode device according to claim 1, wherein the inner circumferential section where the active layer is exposed on the inner circumferential surface of the groove becomes an oblique surface with the groove width becoming gradually narrower as the grooves becomes deeper.

8. The semiconductor laser diode device according to claim 1, wherein the semiconductor substrate is a structure containing bandgap energy that functions as a light absorbing layer to absorb light on the emission wavelength of the active layer, and the semiconductor substrate is comprised of a GaAs substrate, and the first conductive cladding layer is comprised of AlGaInP, and the active layer is a single layer structure comprised of (Al)GaInP or is a multiple quantum well structure made where the quantum well is comprised of GaInP and the quantum barrier comprised of AlGaInP, and the second conductive cladding layer is comprised of AlGaInP, and the second conductive contact layer is comprised of GaAs with a lasing (light emission) wavelength from 600 to 690 nanometers.

9. The semiconductor laser diode device according to claim 1, wherein the semiconductor substrate is a structure containing bandgap energy that functions as a light absorbing layer to absorb light on the emission wavelength of the active layer, and semiconductor substrate is comprised of a GaAs substrate, and the first conductive cladding layer is comprised of AlGaInP, and the active layer is a single layer structure comprised of InGaAsP or is a multiple quantum well structure where the quantum well is comprised of InGaAsP and a quantum barrier is comprised of AlGaInP, and the second conductive cladding layer is comprised of AlGaInP, and the second conductive contact layer is comprised of GaAs with a lasing (light emission) wavelength from 600 to 690 nanometers.

10. The semiconductor laser diode device according to claim 1, wherein refractive index values for all semiconductor layers between the active layer and the semiconductor substrate are larger than the refractive index value of the semiconductor substrate, and the semiconductor substrate is comprised of a Ga(As)P substrate, and the first conductive cladding layer is comprised of AlGaInP, and the active layer is a single layer structure comprised of (Al)GaInP or is a multiple quantum well structure where the quantum well is comprised of GaInP and the quantum barrier comprised of AlGaInP, and the second conductive cladding layer is comprised of AlGaInP, and the second conductive contact layer is comprised of GaAs, and the lasing wavelength is 560 to 640 nanometers.

11. A semiconductor laser diode device comprising:
a semiconductor substrate comprised of a first conductive type semiconductor, containing a first surface and a second surface forming a side opposite the first surface;

a multiple epitaxial layer of sequentially formed semiconductor layers including at least a first conductive cladding layer, an active layer and a second conductive cladding layer on at a first surface of the semiconductor substrate;

a ridge structure formed in a stripe shape extending between one pair of facets opposite each other on first and second end edges of the semiconductor substrate by selectively etching from the upper surface of the second conductive cladding layer to a specified depth on the second cladding layer;

a first conductive current blocking layer pair formed from a first conductive type semiconductor layer enclosing the ridge, and formed on the second conductive cladding layer remaining on both sides of the ridge;

a second conductive contact layer comprised of a second conductivity type semiconductor layer formed on the current blocking layer and the ridge;

a second electrode formed over the second conductive contact layer, and a first electrode formed over the second surface of the semiconductor substrate, wherein the first conductive current blocking layer is a structure containing bandgap energy transparent to light on the emission wavelength of the active layer, wherein grooves are formed on one end or both ends of the ridge, along the first end edge or the first and second end edges of the substrate in a second direction which is substantially perpendicular to the first direction in which the ridge extends, and from the second conductive contact layer separated a specified distance from the side edge of the ridge to the side of the active layer, and at a depth from the second conductive contact layer exceeding the active layer, wherein the groove is covered by an insulating layer, and wherein the second electrode is formed over the insulating layer in the groove section.

12. The semiconductor laser diode device according to claim 11, wherein the semiconductor substrate is comprised of a GaAs substrate, the first conductive cladding layer is comprised of AlGaInP, the active layer is a single layer structure comprised of (Al)GaInP or is a multiple quantum well structure where the quantum well is GaInP and the quantum barrier is comprised of AlGaInP, the second conductive cladding layer is comprised of AlGaInP, and the first conductive current blocking layer is comprised of Al(Ga)InP, and the second conductive contact layer is comprised of GaAs.

13. The semiconductor laser diode device according to claim 1, wherein said semiconductor substrate is a square semiconductor substrate.

14. The semiconductor laser diode device according to claim 11, wherein said semiconductor substrate is a square semiconductor substrate.

15. A semiconductor laser diode device comprising:
a semiconductor substrate comprised of a first conductivity type semiconductor, and including a first surface, and a second surface as a side opposite the first surface;
a multiple epitaxial layer including sequentially formed layers of at least a first conductive cladding layer, an active layer, a second conductive cladding layer and second conductive contact layer on the first surface of the semiconductor substrate;
a ridge structure formed by selectively etching from the upper surface of the second conductive contact layer to a specified depth on the second conductive cladding layer, and extending in a first direction in a stripe shape extending between a front face and a rear facet opposite each other on the semiconductor substrate along first and second end edges, respectively, of the semiconductor substrate;
an insulating layer formed over the first surface side of the semiconductor substrate on a section from a side surface of the ridge to the periphery of the semiconductor substrate;
a second electrode formed over the insulating layer over the second conductive contact layer of the ridge, and
a first electrode formed on the second surface of the semiconductor substrate,
wherein the semiconductor substrate contains bandpass energy serving as an absorption layer for light on the emission wavelength of the active layer, or the refractive index value for all semiconductor layers between the active layer and the semiconductor substrate is larger than the semiconductor substrate refractive index value,
means for blocking excess scattered light and electroluminescent light to prevent said electroluminescent light from being discharged from the front facet, said means comprising grooves formed on both sides at one end of the ridge, said grooves extending along the first end edge of the substrate in a second direction which is substantially perpendicular to the first direction in which the ridge extends, and from the second cladding layer separated a specified distance from a side edge of the ridge to the side of the active layer, and at a depth from the second conductive cladding layer exceeding the active layer, and
wherein the groove is covered by an insulating layer.

16. The semiconductor laser diode device according to claim 15, wherein a facet coating layer is formed on the front facet of the ridge, and a facet coating layer with the same or higher reflectivity is formed on the rear side of the ridge.

17. The semiconductor laser diode device according to claim 15, wherein the distance between the side of the groove and the one end of the ridge is 3 to 50 micrometers.

18. The semiconductor laser diode device according to claim 15, wherein the groove width is 1 to 50 micrometers.

19. The semiconductor laser diode device according to claim 15, wherein the distance from the ridge side to the side of the groove is 1 to 15 micrometers.

20. The semiconductor laser diode device according to claim 15, wherein the upper edge of the insulating layer is at a position deeper than the lower edge of the active layer in the deepest section of the groove.

21. The semiconductor laser diode device according to claim 15, wherein the inner circumferential section where the active layer is exposed on the inner circumferential surface of the groove becomes an oblique surface with the groove width becoming gradually narrower as the groove becomes deeper.

22. The semiconductor laser diode device according to claim 15, wherein the semiconductor substrate is a structure containing bandgap energy that functions as a light absorbing layer to absorb light on the emission wavelength of the active layer, and the semiconductor substrate is comprised of a GaAs substrate, and the first conductive cladding layer is comprised of AlGaInP, and the active layer is a single layer structure comprised of (Al)GaInP or is a multiple quantum well structure made where the quantum well is comprised of GaInP and the quantum barrier comprised of AlGaInP, and the second conductive cladding layer is comprised of AlGaInP, and the second conductive contact layer is comprised of GaAs with a lasing (light emission) wavelength from 600 to 690 nanometers.

23. The semiconductor laser diode device according to claim 15, wherein the semiconductor substrate is a structure containing bandgap energy that functions as a light absorbing layer to absorb light on the emission wavelength of the active layer, and semiconductor substrate is comprised of a GaAs substrate, and the first conductive cladding layer is comprised of AlGaInP, and the active layer is a single layer structure comprised of InGaAsP or is a multiple quantum well structure where the quantum well is comprised of InGaAsP and a quantum barrier is comprised of AlGaInP, and the second conductive cladding layer is comprised of AlGaInP, and the second conductive contact layer is comprised of GaAs with a lasing (light emission) wavelength from 600 to 690 nanometers.

24. The semiconductor laser diode device according to claim 15, wherein refractive index values for all semiconductor layers between the active layer and the semiconductor substrate are larger than the refractive index value of the semiconductor substrate, and the semiconductor substrate is comprised of a Ga(As)P substrate, and the first conductive cladding layer is comprised of AlGaInP, and the active layer is a single layer structure comprised of (Al)GaInP or is a multiple quantum well structure where the quantum well is comprised of GaInP and the quantum barrier comprised of AlGaInP, and the second conductive cladding layer is comprised of AlGaInP, and the second conductive contact layer is comprised of GaAs, and the lasing wavelength is 560 to 640 nanometers.

* * * * *